US012130324B2

(12) United States Patent
Hasegawa et al.

(10) Patent No.: US 12,130,324 B2
(45) Date of Patent: Oct. 29, 2024

(54) TEST APPARATUS, TEST METHOD, AND COMPUTER-READABLE STORAGE MEDIUM

(71) Applicant: ADVANTEST CORPORATION, Tokyo (JP)

(72) Inventors: Kotaro Hasegawa, Saitama (JP); Kouji Miyauchi, Gunma (JP); Go Utamaru, Ibaraki (JP)

(73) Assignee: ADVANTEST CORPORATION, Tokyo (JP)

( * ) Notice: Subject to any disclaimer, the term of this patent is extended or adjusted under 35 U.S.C. 154(b) by 312 days.

(21) Appl. No.: 17/573,581

(22) Filed: Jan. 11, 2022

(65) Prior Publication Data

US 2022/0221504 A1 Jul. 14, 2022

(51) Int. Cl.
*G01R 31/26* (2020.01)
*G01R 31/317* (2006.01)
(Continued)

(52) U.S. Cl.
CPC ... *G01R 31/2635* (2013.01); *G01R 31/31728* (2013.01); *H05B 45/12* (2020.01); *H05B 45/22* (2020.01); *H05B 45/50* (2020.01)

(58) Field of Classification Search
CPC .......... G01R 31/2635; G01R 31/31728; G01R 31/2825; G01R 19/16566; G01R 31/2874;
(Continued)

(56) References Cited

U.S. PATENT DOCUMENTS

| | | | |
|---|---|---|---|
| 5,631,571 A | 5/1997 | Spaziani | |
| 5,990,692 A | 11/1999 | Jeong | |

(Continued)

FOREIGN PATENT DOCUMENTS

| | | |
|---|---|---|
| CN | 1165401 A | 11/1997 |
| CN | 101290340 A | 10/2008 |

(Continued)

OTHER PUBLICATIONS

Office Action issued for counterpart Taiwanese Application No. 110148320, issued by the Taiwan Intellectual Property Office on Sep. 6, 2022.

(Continued)

*Primary Examiner* — Tung X Nguyen
*Assistant Examiner* — Robert P Alejnikov, Jr.

(57) ABSTRACT

A test apparatus includes: an electrical connection unit to be electrically connected to a terminal of each of a plurality of light emitting devices to be tested; a light source unit for collectively irradiating the plurality of light emitting devices with light; a measuring unit for measuring a photoelectric signal obtained by photoelectrically converting light irradiated by the light source unit and output via the electrical connection unit by each light emitting device; an acquisition unit for acquiring a correction map including a correction value for correcting a variation in intensity of light with which a position of each light emitting device is irradiated by the light source unit; and a determination unit for determining a quality of each light emitting device on a basis of a measurement result by the measuring unit and the correction map acquired by the acquisition unit.

15 Claims, 16 Drawing Sheets

(51) Int. Cl.
  *H05B 45/12* (2020.01)
  *H05B 45/22* (2020.01)
  *H05B 45/50* (2022.01)

(58) Field of Classification Search
  CPC .... G01R 31/2894; G01R 35/00; H05B 45/12;
    H05B 45/22; H05B 45/50; G01J 1/4228;
    G01J 2001/4252; G01J 1/08; G01M
    11/02
  USPC .......................................................... 324/414
  See application file for complete search history.

(56) References Cited

U.S. PATENT DOCUMENTS

| | | | |
|---|---|---|---|
| 6,377,300 | B1 | 4/2002 | Morris |
| 6,678,623 | B2 | 1/2004 | Koyama |
| 9,040,896 | B2 | 5/2015 | Walker |
| 9,404,962 | B2 | 8/2016 | Huang |
| 9,551,669 | B2 | 1/2017 | Morrow |
| 9,797,942 | B2 | 10/2017 | Engberg |
| 2004/0173732 | A1 | 9/2004 | Rogers |
| 2004/0257358 | A1 | 12/2004 | Okamoto |
| 2005/0194990 | A1 | 9/2005 | Gothoskar |
| 2007/0285378 | A1* | 12/2007 | Lankhorst ............. G09G 3/342 |
| | | | 345/102 |
| 2008/0218186 | A1 | 9/2008 | Kooiman |
| 2009/0236506 | A1 | 9/2009 | Dudgeon |
| 2010/0053601 | A1 | 3/2010 | Osawa |
| 2010/0208261 | A1 | 8/2010 | Sens |
| 2010/0265064 | A1* | 10/2010 | Mayer ................... H05B 45/12 |
| | | | 340/541 |
| 2012/0136470 | A1 | 5/2012 | Deans |
| 2012/0194211 | A1 | 8/2012 | Osawa |
| 2013/0015331 | A1 | 1/2013 | Birk |
| 2013/0021054 | A1 | 1/2013 | Voltan |
| 2013/0027543 | A1 | 1/2013 | Boeykens |
| 2013/0201321 | A1 | 8/2013 | Chao |
| 2013/0229188 | A1 | 9/2013 | Seymour |
| 2013/0328487 | A1 | 12/2013 | Yoshida |
| 2015/0015890 | A1 | 1/2015 | Zheng |
| 2015/0019168 | A1 | 1/2015 | Masayuki |
| 2015/0253388 | A1 | 9/2015 | Masuda |
| 2016/0073467 | A1* | 3/2016 | McDonald ............. H05B 45/12 |
| 2016/0161294 | A1 | 6/2016 | Ip |
| 2016/0161418 | A1 | 6/2016 | Yeo |
| 2016/0306042 | A1 | 10/2016 | Schrank |
| 2016/0329864 | A1 | 11/2016 | Tu |
| 2017/0181384 | A1 | 6/2017 | Zhu |
| 2017/0208655 | A1 | 7/2017 | Lee |
| 2018/0254226 | A1 | 9/2018 | Iguchi |
| 2018/0276812 | A1 | 9/2018 | Kohyama |
| 2018/0352619 | A1 | 12/2018 | Weber |
| 2019/0004105 | A1 | 1/2019 | Henley |
| 2019/0021233 | A1* | 1/2019 | Hamby .................... G01J 1/08 |
| 2019/0200424 | A1* | 6/2019 | Mochizuki ............ H05B 45/56 |
| 2019/0204235 | A1 | 7/2019 | Nishizawa |
| 2019/0293570 | A1 | 9/2019 | Kobayashi |
| 2020/0096389 | A1 | 3/2020 | Ikemura |
| 2020/0111926 | A1 | 4/2020 | Shr |
| 2020/0174377 | A1 | 6/2020 | Osaka |
| 2020/0194616 | A1 | 6/2020 | Henley |
| 2020/0267810 | A1* | 8/2020 | Chemel .................. H05B 47/19 |
| 2020/0371152 | A1 | 11/2020 | Lin |
| 2020/0379029 | A1* | 12/2020 | Hasegawa .......... G01R 31/2656 |
| 2020/0386805 | A1* | 12/2020 | Kasai .................. G01N 21/8806 |
| 2021/0050553 | A1 | 2/2021 | Ogawa |
| 2021/0270752 | A1 | 9/2021 | Suzuki |
| 2022/0037213 | A1 | 2/2022 | Lee |
| 2022/0178837 | A1* | 6/2022 | Nakamura ............. G01N 21/64 |
| 2022/0276090 | A1* | 9/2022 | Hasegawa ................ G01J 1/08 |

FOREIGN PATENT DOCUMENTS

| | | |
|---|---|---|
| CN | 101583860 A | 11/2009 |
| CN | 102486520 A | 6/2012 |
| CN | 103364707 A | 10/2013 |
| CN | 205844396 U | 12/2016 |
| CN | 103620294 B | 2/2017 |
| CN | 210690739 U | 6/2020 |
| CN | 112151426 A | 12/2020 |
| EP | 2439517 A1 | 4/2012 |
| JP | S50103270 A | 8/1975 |
| JP | S59230143 A | 12/1984 |
| JP | S6161478 A | 3/1986 |
| JP | S62283684 A | 12/1987 |
| JP | H081995 A | 1/1996 |
| JP | 2004266250 A | 9/2004 |
| JP | 2005032704 A | 2/2005 |
| JP | 2006098054 A | 4/2006 |
| JP | 2006215211 A | 8/2006 |
| JP | 2007528129 A | 10/2007 |
| JP | 2010230568 A | 10/2010 |
| JP | 2012084883 A | 4/2012 |
| JP | 2012527662 A | 11/2012 |
| JP | 2013113635 A | 6/2013 |
| JP | 2015119344 A | 6/2015 |
| JP | 2016173385 A | 9/2016 |
| JP | 2017504959 A | 2/2017 |
| JP | 6249513 B1 | 12/2017 |
| JP | 2017223969 A | 12/2017 |
| JP | 6462843 B1 | 1/2019 |
| JP | 6489421 B2 | 3/2019 |
| JP | 2019040192 A | 3/2019 |
| JP | 2019507953 A | 3/2019 |
| JP | 2019075434 A | 5/2019 |
| JP | 2020167433 A | 10/2020 |
| JP | 2020201086 A | 12/2020 |
| KR | 20090091249 A | 8/2009 |
| KR | 101112193 B1 | 2/2012 |
| KR | 20130102268 A | 9/2013 |
| KR | 20170085334 A | 7/2017 |
| TW | 200422597 A | 11/2004 |
| TW | 200730845 A | 8/2007 |
| TW | 200925565 A | 6/2009 |
| TW | 201243310 A | 11/2012 |
| TW | 201316013 A | 4/2013 |
| TW | 201350351 A | 12/2013 |
| TW | 201500750 A | 1/2015 |
| TW | 201528867 A | 7/2015 |
| TW | 201539005 A | 10/2015 |
| TW | 201712353 A | 4/2017 |
| TW | 201928307 A | 7/2019 |
| TW | 201938381 A | 10/2019 |
| TW | 202015329 A | 4/2020 |
| TW | 202023069 A | 6/2020 |
| TW | 202029369 A | 8/2020 |
| TW | 202036838 A | 10/2020 |
| TW | 202045944 A | 12/2020 |
| WO | 2008059767 A1 | 5/2008 |
| WO | 2015045222 A1 | 4/2015 |
| WO | 2015107656 A1 | 7/2015 |
| WO | 2016147266 A1 | 9/2016 |
| WO | 2018062633 A1 | 4/2018 |
| WO | 2018236767 A2 | 12/2018 |

OTHER PUBLICATIONS

Office Action issued for related U.S. Appl. No. 16/817,642, issued by the US Patent and Trademark Office filed Jul. 13, 2021.
Office Action issued for related U.S. Appl. No. 16/817,642, issued by the US Patent and Trademark Office filed Sep. 21, 2021.
Office Action issued for related U.S. Appl. No. 17/577,385, issued by the US Patent and Trademark Office filed Nov. 23, 2022.
Office Action issued for related Japanese Application No. 2021-007928, transmitted from the Japanese Patent Office on Aug. 22, 2023 (drafted on Aug. 16, 2023).
Office Action issued for counterpart Japanese Application No. 2021-003813, transmitted from the Japanese Patent Office on Aug. 8, 2023 (drafted on Aug. 1, 2023).
Office Action issued for counterpart Taiwanese Application 110149281, issued by the Taiwan Intellectual Property Office on Nov. 14, 2022.
Office Action issued for related Japanese Application No. 2021-

(56) References Cited

OTHER PUBLICATIONS 003813, issued by the Japanese Patent Office on Jun. 20, 2023 (drafted on Jun. 15, 2023).
Office Action issued for related Taiwanese Application 111128100, issued by the Taiwan Intellectual Property Office on Apr. 13, 2023.
Office Action issued for counterpart Korean Application 10-2021-0178758, issued by the Korean Intellectual Property Office on Mar. 29, 2024.
Office Action issued for related Japanese Application No. 2019-103155, issued by the Japanese Patent Office on Nov. 22, 2022 (drafted on Nov. 11, 2022).
Office Action issued for counterpart Taiwanese Application 110148130, issued by the Taiwan Intellectual Property Office on Jan. 7, 2023.
Office Action issued for counterpart Taiwanese Application 112116170, issued by the Taiwan Intellectual Property Office on Jul. 14, 2023.
Office Action issued for related Japanese Application No. 2021-145919, issued by the Japanese Patent Office on Jul. 11, 2023 (drafted on Jul. 4, 2023).
Office Action issued for counterpart Taiwanese Application 109107015, issued by the Taiwan Intellectual Property Office on Aug. 27, 2020.
Office Action issued for counterpart Taiwanese Application 109107015, issued by the Taiwan Intellectual Property Office on Nov. 30, 2020.
Office Action issued for counterpart Korean Application10-2020-0025876, issued by the Korean Intellectual Property Office on Jan. 7, 2021.
Notice of First Office Action for Patent Application No. 202010290804.5, issued by The National Intellectual Property Administration of the People's Republic of China on Feb. 7, 2022.
Office Action issued for related Korean Application 10-2021-0180619, issued by the Korean Intellectual Property Office on Mar. 18, 2024.
Office Action issued for related Taiwanese Application 110148320, issued by the Taiwan Intellectual Property Office on Jan. 16, 2023.
Office Action issued for counterpart Japanese Application No. 2023-183582, transmitted from the Japanese Patent Office on May 21, 2024 (drafted on May 13, 2024).

* cited by examiner

TEST APPARATUS, TEST METHOD, AND COMPUTER-READABLE STORAGE MEDIUM

The contents of the following Japanese patent application(s) are incorporated herein by reference:
NO. 2021-003813 filed in JP on Jan. 13, 2021

BACKGROUND

1. Technical Field

The present invention relates to a test apparatus, a test method, and a computer-readable storage medium.

2. Related Art

A method is known in which one of a pair of LEDs to be inspected is caused to emit light and the other is caused to receive the light, and optical characteristics of the LED are inspected using a current value of a current output by a photoelectric effect (see, for example, Patent Documents 1 and 2).

CITATION LIST

Patent Document

Patent Document 1: Japanese translation publication of PCT route patent application No. 2019-507953
Patent Document 2: Japanese Patent Application Publication No. 2010-230568

DESCRIPTION OF EXEMPLARY EMBODIMENTS

Figure 1:
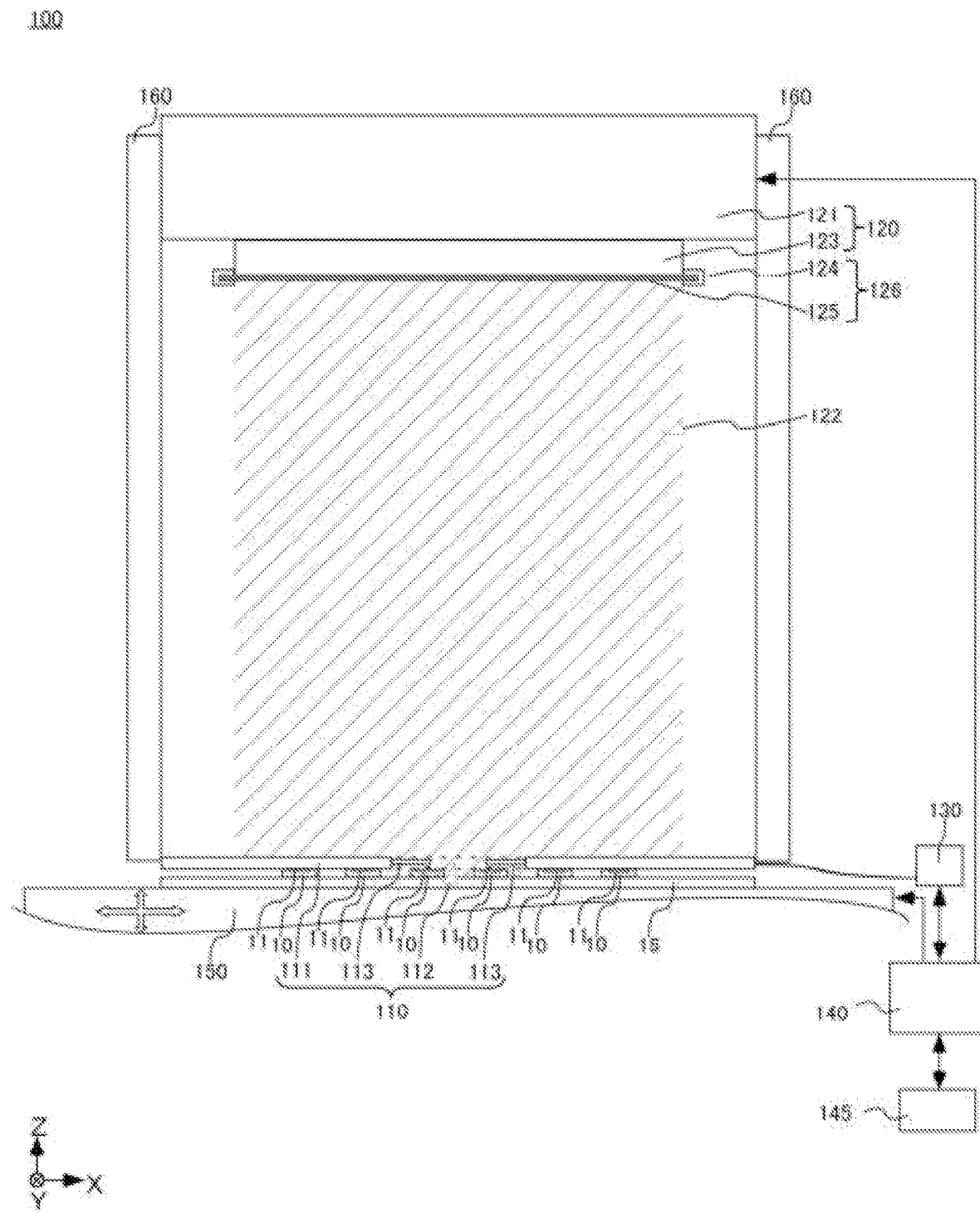
FIG. 1 is an example of an overall view illustrating an outline of a test apparatus 100 for testing a plurality of LEDs 10.

Hereinafter, the present invention will be described through embodiments of the invention, but the following embodiments do not limit the invention according to the claims. In addition, not all combinations of features described in the embodiments are essential to the solution of the invention. In the drawings, the same or similar parts are denoted by the same reference numerals, and redundant description may be omitted.

FIG. 1 is an example of an overall view illustrating an outline of a test apparatus 100 for testing a plurality of LEDs 10. In FIG. 1, an X axis having a +X direction in the right-hand direction facing the paper surface, a Z axis having a +Z direction in the upper direction facing the paper surface, and a Y axis having a +Y direction in the depth direction facing the paper surface are illustrated so as to be orthogonal to each other. Hereinafter, description may be made using these three axes.

The test apparatus 100 uses the photoelectric effect of the LED 10 to collectively test the optical characteristics of the plurality of LEDs 10 on the basis of the photoelectric signal output from the LED 10 irradiated with light. The test apparatus 100 includes an electrical connection unit 110, a light source unit 120, a temperature control unit 126, a measuring unit 130, a control unit 140, a storage unit 145, a placement unit 150, and a blocking unit 160. The test apparatus 100 may not include the temperature control unit 126, the storage unit 145, the placement unit 150, and the blocking unit 160.

The test apparatus 100 according to the present embodiment collectively tests the optical characteristics of a specific set of the plurality of LEDs 10 in the LED group in a state where the LED group in which the plurality of LEDs 10 are formed on a wafer 15, which is the LED wafer before the wiring by the backplane is provided, is placed on the placement unit 150. The LED 10 in the present embodiment is a micro LED having a dimension of 100 μm or less. Note that, instead of the micro LED, the LED 10 may be a mini LED having a dimension larger than 100 μm and equal to or less than 200 μm, an LED having a dimension larger than 200 μm, or another light emitting device such as an LD.

In addition, the plurality of LEDs 10 in the present embodiment are not electrically connected to each other on the wafer 15. Note that the plurality of LEDs 10 may be formed on a wafer provided with electric wiring or on a glass-based panel (PLP) having a substantially rectangular outer shape, and may be electrically connected to each other to be formed in units or cells. In this case, for example, the respective colors of RGB may be mixed by a technique of performing laser lift-off and transferring from the respective monochromatic wafers of RGB or a technique of dyeing or applying a fluorescent paint on a monochromatic wafer of any of RGB.

The electrical connection unit 110 is, for example, a probe card (probe substrate), and is electrically connected to a terminal 11 of each of the plurality of LEDs 10 to be tested. Note that, in the specification of the present application, in a case where the term "being electrically connected" is defined, it is intended to be electrically connected by contact or to be electrically connected in a non-contact manner. The electrical connection unit 110 in the present embodiment is electrically connected by being in contact with the terminal 11 of each of the plurality of LEDs 10, but may be electrically connected in a non-contact manner by, for example, electromagnetic induction or near field communication.

The electrical connection unit 110 in the present embodiment also sequentially switches a set of the plurality of LEDs to be tested to which it connects from among the LED group placed on the placement unit 150 by the placement unit 150 moving with the LED group placed thereon. The electrical connection unit 110 in the present embodiment is disposed between the light source unit 120 and the plurality of LEDs 10, and includes a substrate 111 and a plurality of probes 113.

The substrate 111 has an opening 112 that allows light from the light source unit 120 to pass toward the plurality of LEDs 10. In FIG. 1, the opening 112 is indicated by a broken line.

The plurality of probes 113 extend from the substrate 111 toward each of the plurality of LEDs 10 exposed in the opening 112 and contact the terminal 11 of each of the plurality of LEDs 10. The other end of each probe 113 opposite to the one end in contact with the terminal 11 is electrically connected to the electric wiring provided on the substrate 111. The plurality of electric wirings of the plurality of probes 113 extend from the side surface of the substrate 111 and are electrically connected to the measuring unit 130.

Note that it is preferable that the plurality of probes 113 have the same shape and dimension with each other and have the same distance, with each other, from the LEDs 10 they are in contact with so that the light reception amounts of each of the plurality of LEDs 10 are equal to each other. In addition, each of the plurality of probes 113 is preferably plated or colored so that light is not diffusely reflected on the surface of the probe 113.

The light source unit 120 collectively irradiates the plurality of LEDs 10 with light. The light source unit 120 in the present embodiment irradiates the plurality of LEDs with light in a reaction wavelength band of the plurality of LEDs. The light source unit 120 in the present embodiment includes a light source 121 and a lens unit 123.

The light source 121 emits light in the reaction wavelength band of the plurality of LEDs 10. The light source 121 may be, for example, a light source that emits light in a wide wavelength band, such as a xenon light source, or may be a light source that emits light in a narrow wavelength band, such as a laser light source. The light source 121 may include a plurality of laser light sources having wavelengths that are different from each other.

The lens unit 123 includes one or more lenses, is provided adjacent to the irradiation unit of the light source 121, and converts the diffused light irradiated from the light source 121 into parallel light 122. In FIG. 1, the parallel light 122 is indicated by hatching. The projection plane of the parallel light 122 in the XY plane covers at least the opening 112 of the substrate 111.

The temperature control unit 126 suppresses temperature rise of the plurality of LEDs 10 due to irradiation with the light. The temperature control unit 126 in the present embodiment includes a temperature suppression filter 125 and a filter holding unit 124. The temperature suppression filter 125 has high light transmittance and absorbs a heat ray of incident light. The filter holding unit 124 is provided adjacent to the lens unit 123 and holds the temperature suppression filter 125. Note that the temperature control unit 126 may further include a cooler that cools the heat absorbed by the temperature suppression filter 125.

In order to keep the temperatures of the plurality of LEDs 10 constant, the temperature control unit 126 may include, instead of or in addition to the above configuration, a temperature applying apparatus that adjusts the temperatures of the plurality of LEDs 10, an air blowing mechanism that blows air toward the plurality of LEDs 10, and the like. In a case where the air blowing mechanism is used, the temperature control unit 126 may further include a static electricity removing unit that prevents the plurality of LEDs 10 from being charged with static electricity when air is blown by the air blowing mechanism. The static electricity removing unit may be, for example, an ionizer. The above described temperature applying apparatus may be provided on the placement unit 150, the substrate 111, or the like in a manner contacting the plurality of LEDs 10. In addition, the above described air blowing mechanism may be provided on the side of the placement unit 150 so as not to contact the plurality of LEDs 10.

The measuring unit 130 measures the photoelectric signal which is obtained by photoelectrically converting the light irradiated by the light source unit 120 and output via the electrical connection unit 110 by each of the plurality of LEDs 10. The measuring unit 130 in the present embodiment measures the photoelectric signal from a set of the plurality of LEDs 10 to which the electrical connection unit 110 is sequentially connected.

More specifically, the measuring unit 130 in the present embodiment is connected to the electrical wiring electrically connected to each probe 113 of the electrical connection unit 110, and measures the current value of the current output from the set of the plurality of LEDs 10 switched to contact the plurality of probes 113 among the LED group placed on the placement unit 150. Note that the measuring unit 130 may measure a voltage value corresponding to the current value instead of the current value.

The measuring unit 130 according to the present embodiment further measures the intensity of light with which the position of each of the plurality of LEDs 10 is irradiated by the light source unit 120. Note that the measuring unit 130 also functions as an example of a second measuring unit.

The control unit 140 controls each component of the test apparatus 100. The control unit 140 in the present embodiment controls the light source 121 of the light source unit 120, thereby controlling the irradiation time, wavelength, and intensity of the parallel light 122 with which the plurality of LEDs 10 are collectively irradiated. The control unit 140 according to the present embodiment also controls the placement unit 150, thereby performing control to sequentially switch a set of the plurality of LEDs 10 to be tested from among the LED group placed on the placement unit 150. More specifically, the control unit 140 drives the placement unit 150 so that the probe 113 comes into contact with the terminal 11 of each LED 10 of the set. Note that the control unit 140 may grasp the position coordinates in the space of the plurality of probes 113 and the relative position between each of the plurality of probes 113 and each LED 10 on the placement unit 150 by referring to the reference data in the storage unit 145.

The control unit 140 further acquires a correction map including a correction value for correcting the variation in intensity of the light with which each position of the plurality of LEDs 10 is irradiated by the light source unit 120. The control unit 140 in the present embodiment generates the correction map on the basis of the measurement result by the measuring unit 130 in advance, and stores the correction map in the storage unit 145. In the case where the measurement results of the plurality of LEDs 10 are acquired, the control unit 140 in the present embodiment acquires the correction map from the storage unit 145. Note that the correction map may be generated and held by an external apparatus having the same light source as the light source 121. In this case, the control unit 140 may acquire the correction map from the external apparatus.

The control unit 140 further determines the quality of each of the plurality of LEDs 10 on the basis of the measurement result by the measuring unit 130 and the above described correction map. More specifically, the control unit 140 in the present embodiment corrects the measurement value of the photoelectric signal measured for each of the plurality of LEDs 10 by the measuring unit 130 using the correction value for the position of each of the plurality of LEDs 10 in the correction map. The control unit 140 according to the present embodiment further determines the quality of each of the plurality of LEDs 10 on the basis of the corrected measurement value of the photoelectric signal.

The control unit 140 according to the present embodiment further determines at least one LED in which the correction value obtained by correcting the measured photoelectric signal by the correction map is out of the normal range among the plurality of LEDs 10 as defective. The control unit 140 controls the sequence of these configurations by referring to the storage unit 145. Note that the control unit 140 serves as an example of an acquisition unit, a determination unit, and a generation unit.

The storage unit 145 stores the above described correction map, reference data for determining the quality of each of the plurality of LEDs 10, a determination result, reference data for moving the placement unit 150, a sequence and a program for controlling each component in the test apparatus 100, and the like. The storage unit 145 is referred to by the control unit 140.

The LED group is placed in the placement unit 150. The placement unit 150 in the illustrated example has a substantially circular outer shape in a plan view, but may have another outer shape. The placement unit 150 has a function of holding a vacuum chuck, an electrostatic chuck, and the like, and holds the wafer 15 of the placed LED group. The placement unit 150 moves two-dimensionally in the XY plane and moves up and down in the Z axis direction by being driven and controlled by the control unit 140. In FIG. 1, illustration of the placement unit 150 on the negative direction side of the Z axis will be omitted. In addition, in FIG. 1, the moving direction of the placement unit 150 is indicated by a white arrow. The same applies to the following drawings.

The blocking unit 160 blocks light other than the light from the light source unit 120. The surface of the blocking unit 160 in the present embodiment is entirely painted black to prevent irregular reflection of light on the surface. In addition, as illustrated in FIG. 1, the blocking unit 160 in the present embodiment is provided so as to be in close contact with each of the outer periphery of the light source 121 and the outer periphery of the substrate 111, and this configuration blocks light other than the light from the light source unit 120.

Figure 2:
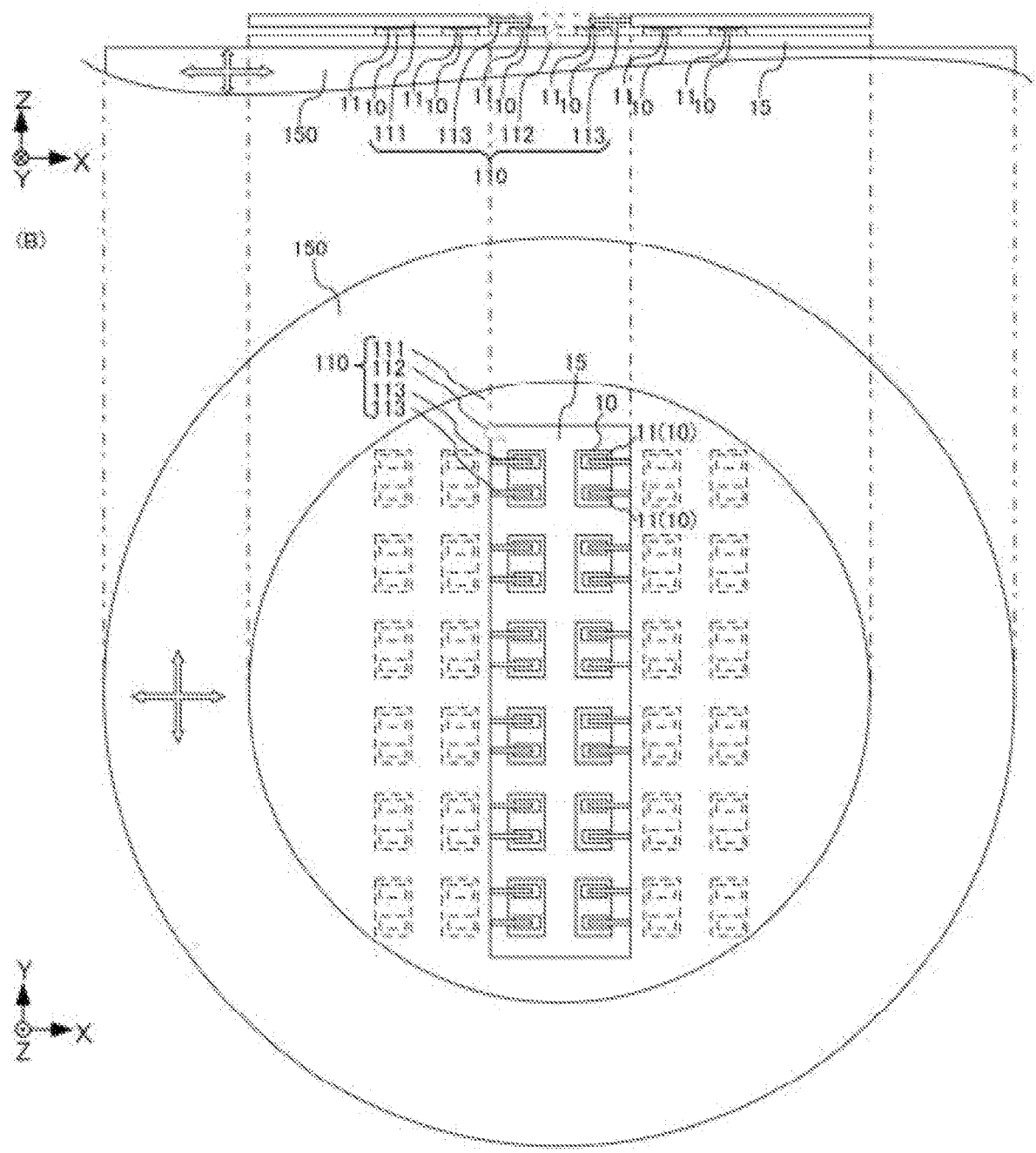
FIG. 2 is an example (A) of a side view and an example (B) of a plan view of a placement unit 150, an LED group placed on the placement unit 150, and an electrical connection unit 110 in a state where a plurality of probes 113 are in contact with a specific set of the plurality of LEDs 10 in the LED group.

FIG. 2 is an example of a side view (A) and an example of a plan view (B) of the placement unit 150, an LED group placed on the placement unit 150, and the electrical connection unit 110 in a state where a plurality of probes 113 are in contact with a specific set of the plurality of LEDs 10 in the LED group. (A) of FIG. 2 extracts and illustrates only the placement unit 150, the LED group, and the electrical connection unit 110 illustrated in FIG. 1. In (B) of FIG. 2, the plurality of LEDs 10 that cannot be visually recognized due to the substrate 111 in the LED group on the placement unit 150 are indicated by broken lines.

As illustrated in (B) of FIG. 2, two terminals 11 are formed on each LED 10 so as to be separated from each other in the Y axis direction. In addition, the plurality of LEDs 10 are placed in a state of being arranged in a matrix on the placement unit 150, and in the illustrated example, are arranged in a matrix of 6 columns in the X axis direction and 6 rows in the Y axis direction.

The opening 112 of the substrate 111 has a rectangular profile elongated in the Y axis direction. In the illustrated example, as a set of the plurality of LEDs 10 of which the optical characteristics are collectively measured, twelve LEDs 10 of two columns in the X axis direction and six rows in the Y axis direction are exposed in the opening 112. One probe 113 of the electrical connection unit 110 is configured to be in contact with each of the plurality of terminals 11 located in the opening 112 of the substrate 111.

Figure 3:
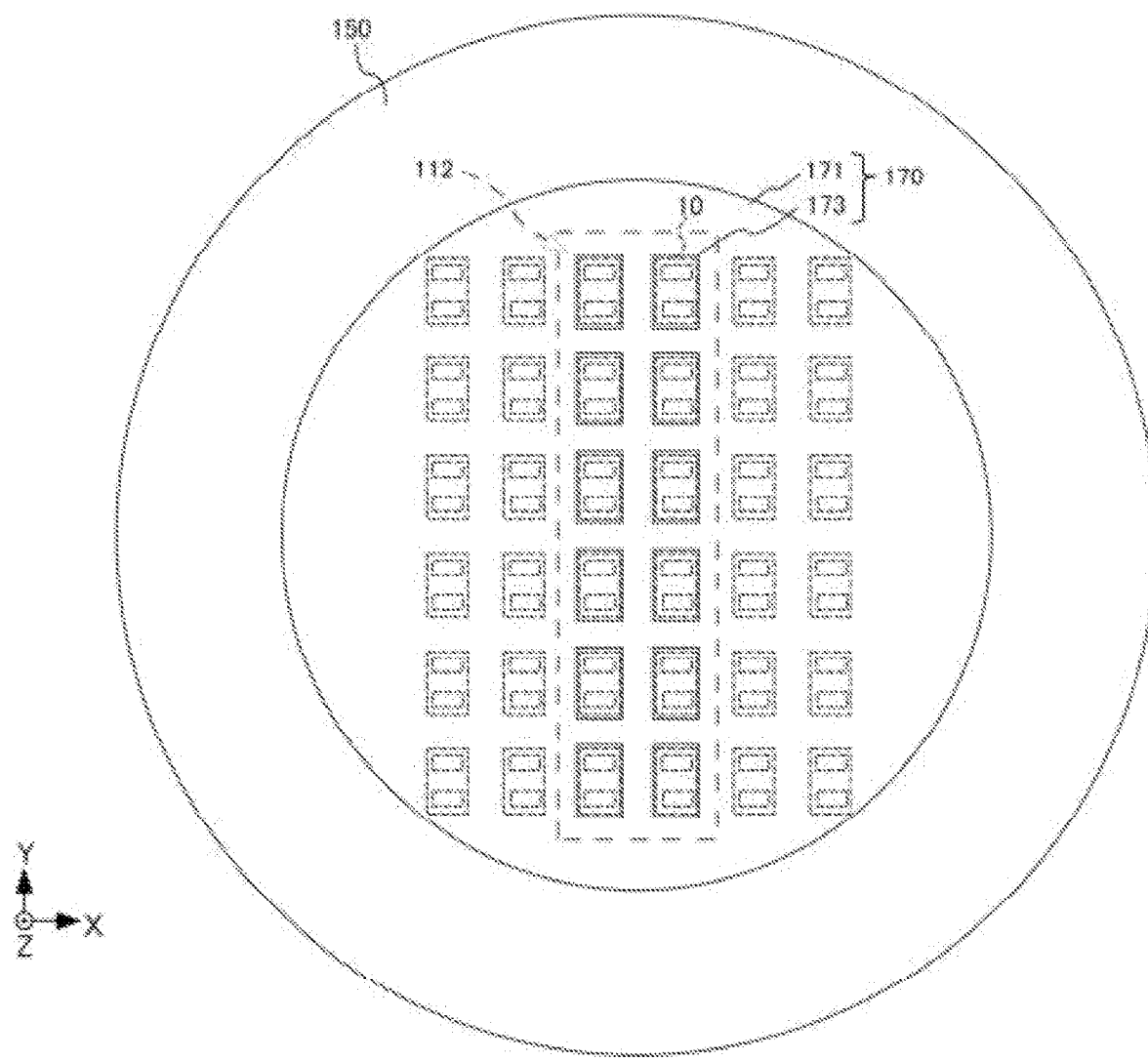
FIG. 3 is an example of a plan view of the placement unit 150 and a light intensity measurement unit 170 placed on the placement unit 150.

FIG. 3 is an example of a plan view of the placement unit 150 and a light intensity measurement unit 170 placed on the placement unit 150. The light intensity measurement unit 170 is disposed at the same position as the wafer 15 on the placement unit 150 when the wafer 15 holding the plurality of LEDs 10 is not placed on the placement unit 150. In FIG. 3, the opening 112 and the plurality of LEDs 10 are each indicated by broken lines.

The measuring unit 130 in the present embodiment includes a light intensity measurement unit 170. The light intensity measurement unit 170 in the present embodiment includes a holding unit 171 and a plurality of sensors 173. The holding unit 171 is a substrate-shaped member and holds the plurality of sensors 173 disposed in the surface. Each of the plurality of sensors 173 may be a sensor that detects luminance and/or illuminance of a surrounding environment, such as a photodiode. Each of the plurality of sensors 173 may be set in dimension according to, for example, a ratio of the number of the plurality of sensors 173 to the number of the plurality of LEDs 10. In the case where the ratio is 1:1, as an example, each sensor 173 may have the same dimension as the LED 10.

The light intensity measurement unit 170 has a group of sensors 173 covering the same area as the plurality of LEDs 10 exposed from the substrate 111 in the opening 112, and as an example, may have the same number of sensors 173 as the plurality of LEDs 10 exposed. Similarly to the wafer 15 illustrated in FIG. 1 and FIG. 2, with the holding unit 171 placed on the placement unit 150, each of the plurality of sensors 173 exposed in the opening 112 is disposed at the same position as each of the plurality of LEDs 10 exposed in the opening 112.

Note that the light intensity measurement unit 170 may be provided in the placement unit 150 instead of the above described configuration. In this case, when the wafer 15 is not placed in the placement unit 150, that is, when the light from the light source unit 120 is not blocked by the wafer 15, the plurality of sensors 173 of the light intensity measurement unit 170 may receive the light.

Figure 4:
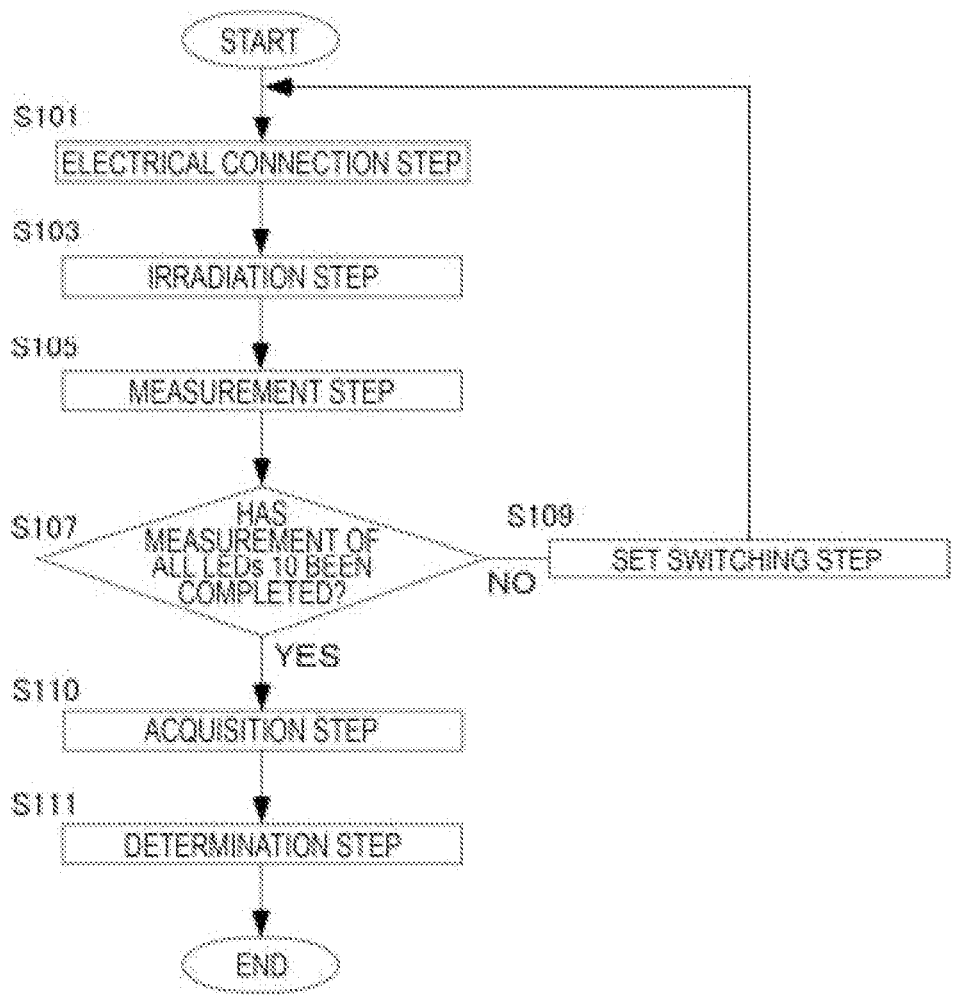
FIG. 4 is an example of a flowchart for explaining a flow of a test method by the test apparatus 100.

FIG. 4 is an example of a flowchart for explaining a flow of a test method by the test apparatus 100. The flow is started when, for example, a user performs an input for starting a test of the LED group with respect to the test apparatus 100 with the LED group placed on the placement unit 150.

The test apparatus 100 executes an electrical connection step of electrically connecting the electrical connection unit 110 to the terminal 11 of each of the plurality of LEDs 10 to be tested (Step S101). As a specific example, the control unit 140 outputs a command to the placement unit 150, and moves the placement unit 150 such that a set of the plurality of LEDs 10 to be tested first among the LED groups on the placement unit 150 comes into contact with the plurality of probes 113.

The test apparatus 100 executes an irradiation step of collectively irradiating the plurality of LEDs 10 with light (Step S103). As a specific example, the control unit 140 outputs a command to the light source unit 120, and irradiates a set of the plurality of LEDs 10 exposed in the opening 112 with the parallel light 122.

The test apparatus 100 executes a measurement step of measuring the photoelectric signal which is obtained by photoelectrically converting irradiated light and output via the electrical connection unit 110 by each of the plurality of LEDs 10 (Step S105). As a specific example, the control unit 140 issues a command to the measuring unit 130, causes the measuring unit 130 to measure the current value of the current output from the set of the plurality of LEDs 10 switched to contact the plurality of probes 113 among the LED group placed on the placement unit 150, and causes the measurement result to be output to the control unit 140.

The control unit 140 stores the respective measurement results of the sets of the plurality of LEDs 10 in the storage unit 145.

The test apparatus 100 determines whether the measurement of all the LEDs 10 placed on the placement unit 150 has been completed (Step S107), and if not completed (Step S107: NO), executes a set switching step of switching a set of the plurality of LEDs 10 to be tested (Step S109), and returns to Step S101. As a specific example, the control unit 140 refers to the reference data in the storage unit 145, determines whether the measurement results of all the LEDs 10 placed on the placement unit 150 are stored, and if not stored, issues a command to the placement unit 150, and then moves the placement unit 150 so as to switch to a set of the plurality of LEDs 10 to be tested.

In a case where the measurement of all the LEDs 10 placed on the placement unit 150 has been completed in Step S107 (Step S107: YES), the test apparatus 100 executes an acquisition step of acquiring a correction map including a correction value for correcting the variation in intensity of the light with which the position of each of the plurality of LEDs is irradiated (Step S110). As a specific example, the control unit 140 acquires a correction map generated in advance and stored in the storage unit 145.

The test apparatus 100 executes a determination step of determining the quality of each of the plurality of LEDs 10 on the basis of the measurement result of the above described measurement step and the above described correction map (Step S111), and the flow ends. As a specific example, the control unit 140 refers to the reference data in the storage unit 145, and in a case where the measurement results of all the LEDs 10 placed on the placement unit 150 are stored, determines the quality of each of the plurality of LEDs 10 on the basis of the measurement results and the correction map.

The control unit 140 according to the present embodiment determines, as described above, at least one LED 10, in which the correction value obtained by correcting the measured photoelectric signal by the correction map is out of the normal range among the plurality of LEDs 10 as defective. As an example of the normal range described herein, a range based on a statistic corresponding to a correction value obtained by correcting the photoelectric signal output by each of the plurality of LEDs 10 by the correction map may be used.

More specifically, as an example of the normal range, a range based on a statistic in the entire wafer 15, that is, a statistic of the plurality of LEDs 10 of the correction value obtained by correcting the current value of the current output from each of the plurality of LEDs 10 on the placement unit 150 using the correction map may be used, or a range based on a statistic of the correction value in the entire lot including the wafer 15 may be used. As an example of the statistic, a range within the average value $\pm 1\sigma$, a range within the average value $\pm 2\sigma$, or a range within the average value $\pm 3\sigma$ of the correction value may be used.

In this case, the control unit 140 corrects, using the correction map, the current value of the current output from each of the plurality of LEDs 10 on the placement unit 150 stored in the storage unit 145 to calculate the correction value, and calculates the average value and the standard deviation $\sigma$ on the basis of the correction value. In a case where there are a plurality of peaks in the correction value, the statistic of the correction values may be calculated using statistical processing capable of corresponding to the plurality of peaks without using the standard deviation.

As another example of the above described normal range, a range based on a statistic corresponding to a correction value obtained by correcting the photoelectric signals output by the LEDs 10 disposed at the same position among sets of the plurality of LEDs 10 by the correction map in the measurement results obtained by performing a plurality of measurements by the measuring unit 130 while sequentially changing the set of the plurality of LEDs 10 to be tested from the LED group may be used. More specifically, as an example of the normal range, for example, a range within an average value $\pm 1\sigma$, a range within the average value $\pm 2\sigma$, or a range within the average value $\pm 3\sigma$ of the correction values obtained by correcting, with the LEDs 10 disposed in the same row and the same column, among the LED groups arranged in a matrix of 6 columns in the X axis direction and 6 rows in the Y axis direction on the placement unit 150 illustrated in FIG. 2, as target LEDs, the current value of the current output from the target LED in each of the plurality of LED groups on the plurality of placement units 150 using the correction map may be used. In this case, the control unit 140 corrects the current values of the currents output from the plurality of target LEDs stored in the storage unit 145 using the correction map to calculate the correction value, and calculates the average value and the standard deviation $\sigma$ on the basis of the correction value.

As another example of the above described normal range, a range obtained by adding a margin determined on the basis of the specification of the LED 10 to a reference value determined on the basis of the specification of the LED 10 may be used. In this case, the control unit 140 may refer to information indicating the range stored in advance in the storage unit 145.

Figure 5:
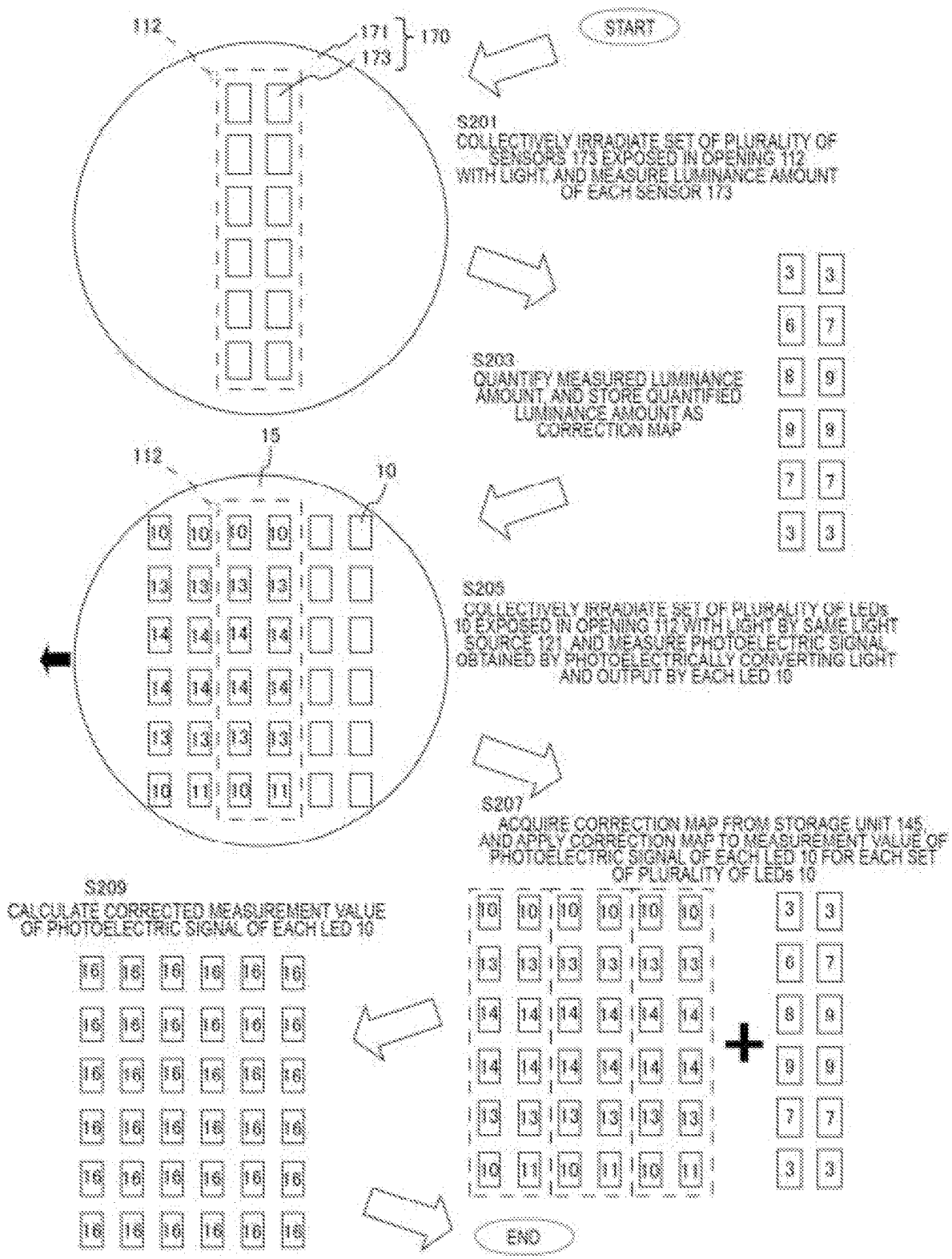
FIG. 5 is an example of a flowchart illustrating a flow of generating a correction map to calculate a corrected measurement value of a photoelectric signal of each LED 10 by the test apparatus 100.

FIG. 5 is an example of a flowchart for explaining a flow of generating a correction map and calculating a corrected measurement value of the photoelectric signal of each LED 10 by the test apparatus 100. The flow is started when, for example, a user performs an input for starting the flow with respect to the test apparatus 100 with the light intensity measurement unit 170 disposed on the placement unit 150.

The test apparatus 100 collectively irradiates a set of the plurality of sensors 173 exposed in the opening 112 with light by the light source 121, and measures the luminance amount of each sensor 173 (Step S201). The test apparatus 100 quantifies the measured luminance amount and stores the quantified luminance amount in the storage unit 145 as data of the correction map as illustrated in FIG. 5 (Step S203).

The test apparatus 100 drives the placement unit 150 as indicated by a black arrow in FIG. 5 to move the wafer 15 in parallel, and collectively irradiates a set of the plurality of LEDs 10 exposed in the opening 112 with light by the same light source 121, and measures the photoelectric signal which is obtained by photoelectrically converting the light and output by each LED 10 (Step S205). The test apparatus 100 acquires the correction map from the storage unit 145, and applies the correction map to the measurement value of the photoelectric signal of each LED 10 for each set of the plurality of LEDs 10 (Step S207). The test apparatus 100 calculates the corrected measurement value of the photoelectric signal of each LED 10 (Step S209), and ends the flow.

Note that Step S205 in the flow corresponds to Steps S101 to S109 in the flow illustrated in FIG. 4, and Steps S207 and S209 in the flow correspond to Steps S110 and S111 in the flow illustrated in FIG. 4. The corrected measurement value calculated in the flow is used in the determination in Step S111 illustrated in FIG. 4.

Figure 6:
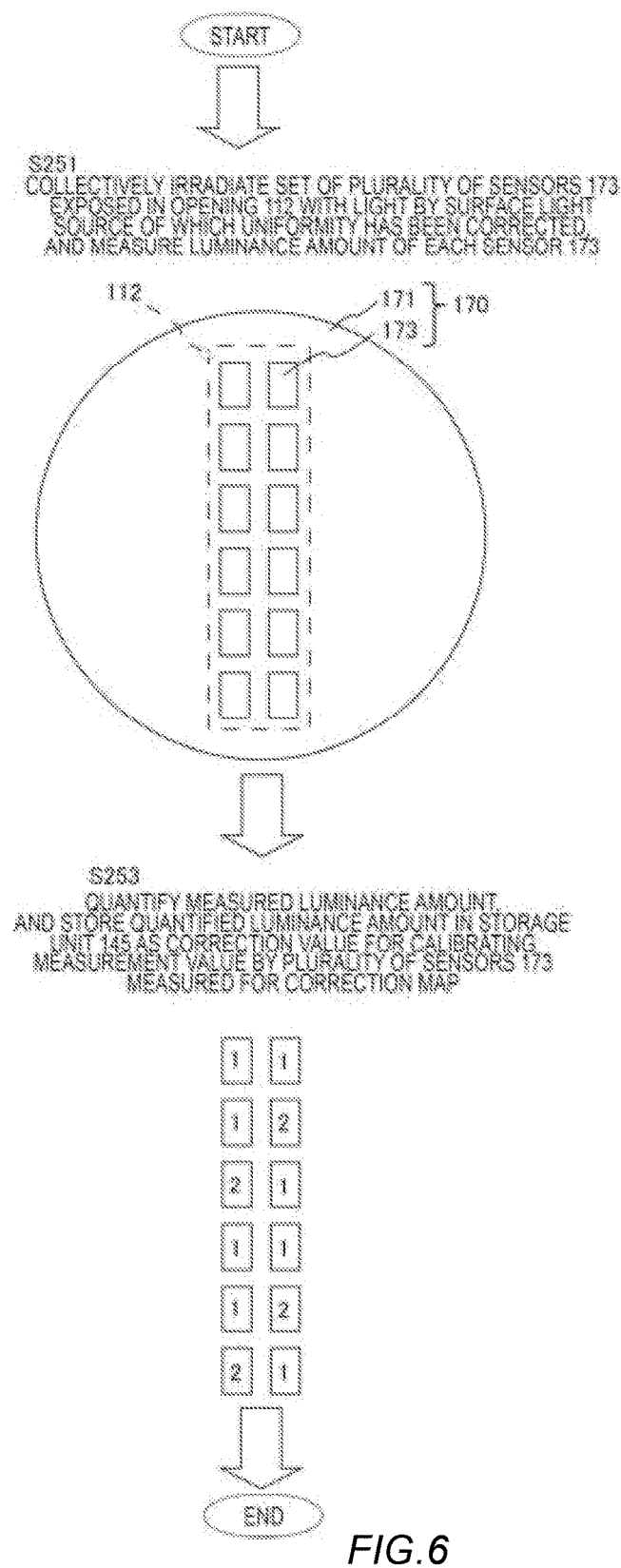
FIG. 6 is an example of a flowchart for explaining a flow of calculating a correction value for calibrating the measurement values of a plurality of sensors 173 of the light intensity measurement unit 170 by the test apparatus 100.

FIG. 6 is an example of a flowchart for explaining a flow of calculating a correction value for calibrating the measurement values of the plurality of sensors 173 of the light intensity measurement unit 170 by the test apparatus 100. The flow is started when, for example, the user performs an input for starting the flow with respect to the test apparatus 100 with the light source 121 of the light source unit 120 replaced with a surface light source of which the uniformity has been calibrated, and the light intensity measurement unit 170 disposed on the placement unit 150 for example.

The control unit 140 in the present embodiment may additionally calibrate the measurement values by the plurality of sensors 173 of the light intensity measurement unit 170 by the surface light source of which the uniformity has been calibrated. The test apparatus 100 collectively irradiates a set of the plurality of sensors 173 exposed in the opening 112 with light by the surface light source of which the uniformity has been calibrated, and measures the luminance amount of each sensor 173 (Step S251). The test apparatus 100 quantifies the measured luminance amount and stores the quantified luminance amount in the storage unit 145 as a correction value for calibrating the measurement values by the plurality of sensors 173 measured for the correction map (Step S253), and the flow ends.

As a comparative example with the test method by the test apparatus 100 of the present embodiment, for example, a test method of optical characteristics of LEDs is conceivable, in which a plurality of LEDs arranged on a wafer are sequentially turned on one by one, and light is received by an image sensor, a spectral luminance meter, or the like to determine whether the light is correctly emitted.

In a case where the optical characteristics of the plurality of LEDs described above are collectively measured using the test method of the comparative example, light irradiated from each of the plurality of adjacent LEDs interferes with each other, and a defective LED having a relatively deteriorated optical characteristic cannot be correctly identified. In addition, an image sensor or the like becomes very expensive for performing image recognition in a wide range with high accuracy. In particular, in a case where a plurality of micro LEDs are tested, the problem becomes remarkable.

On the other hand, according to the test apparatus 100 of the present embodiment, the electrical connection unit 110 is electrically connected to the terminal 11 of each of the plurality of LEDs 10 to be tested, the plurality of LEDs 10 are collectively irradiated with light, a photoelectric signal is measured which is obtained by photoelectrically converting irradiated light, and output via the electrical connection unit 110 by each of the plurality of LEDs 10. Further, according to the test apparatus 100, the quality of each of the plurality of LEDs 10 is determined on the basis of the measurement results of the plurality of LEDs 10. As a result, the test apparatus 100 can not only shorten the processing time by simultaneously measuring the photoelectric signals of the plurality of LEDs 10, but also can correctly identify a defective LED 10 having deteriorated optical characteristics by determining the quality of the LED 10 using the photoelectric signals measured without being affected by the measurement of the optical characteristics of the other LEDs 10. In addition, according to the test apparatus 100, the number of LEDs 10 to be simultaneously measured can be easily expanded.

In a case where the photoelectric signal output by collectively irradiating the plurality of LEDs with the light from the light source is measured, the outside of the irradiation region of the light with which the plurality of LEDs are irradiated from the light source may be darker than the center side, or the intensity of light may vary depending on the position in the irradiation region. On the other hand, according to the test apparatus 100 of the present embodiment, the quality of each of the plurality of LEDs 10 is determined on the basis of the measurement value of the photoelectric signal output by each of the plurality of LEDs 10 and the correction map including the correction value for correcting the variation in intensity of the light with which the position of each of the plurality of LEDs 10 is irradiated by the light source unit 120. As a result, the test apparatus 100 can correct the variation in intensity of the light with which the position of each of the plurality of LEDs 10 is irradiated by the light source unit 120, and can enhance the measurement accuracy of the optical characteristics of the plurality of LEDs 10.

According to the test apparatus 100 of the present embodiment, the plurality of probes 113 and the substrate 111 used for measuring the optical characteristics of the plurality of LEDs 10 can also be shared for measurement of the electrical characteristics of the plurality of LEDs 10, for example, a VI test using an LED tester.

According to the test apparatus 100 of the present embodiment, for the other configurations except for the light source unit 120 and the blocking unit 160, that is, for the electrical connection unit 110, the measuring unit 130, the control unit 140, the storage unit 145, and the placement unit 150, those used for testing devices other than optical devices such as the LED group can be used.

In the above embodiment, the plurality of LEDs 10 have been described as a configuration in which the terminals 11 are on the light emitting surface side. Alternatively, the plurality of LEDs 10 may have terminals 11 on the opposite side of the light emitting surface. The plurality of probes 113 may have different lengths depending on whether each terminal 11 of the plurality of LEDs 10 is located on the light emitting surface side or on the opposite side of the light emitting surface.

In the above embodiment, the configuration has been described in which the placement unit 150 on which the LED group is placed is moved so that the position coordinates of the plurality of probes 113 of the electrical connection unit 110 and the position coordinates of the plurality of LEDs 10 of the LED group coincide with each other in the XY plane, and then the placement unit 150 is moved up and down to bring the plurality of terminals 11 of the plurality of LEDs 10 into contact with the plurality of probes 113. Alternatively, the plurality of terminals 11 of the plurality of LEDs 10 may be brought into contact with the plurality of probes 113 by moving the substrate 111 up and down after the movement in the above described XY plane.

In the above embodiment, the placement unit 150 has been described as having a substantially circular outer shape. Alternatively, for example, in a case where an LED group in which a plurality of LEDs 10 are formed is placed on a glass-based panel (PLP) having a substantially rectangular outer shape in which electric wiring are formed, the placement unit 150 may have a substantially rectangular outer shape in correspondence with the outer shape of the LED group.

Figure 7:
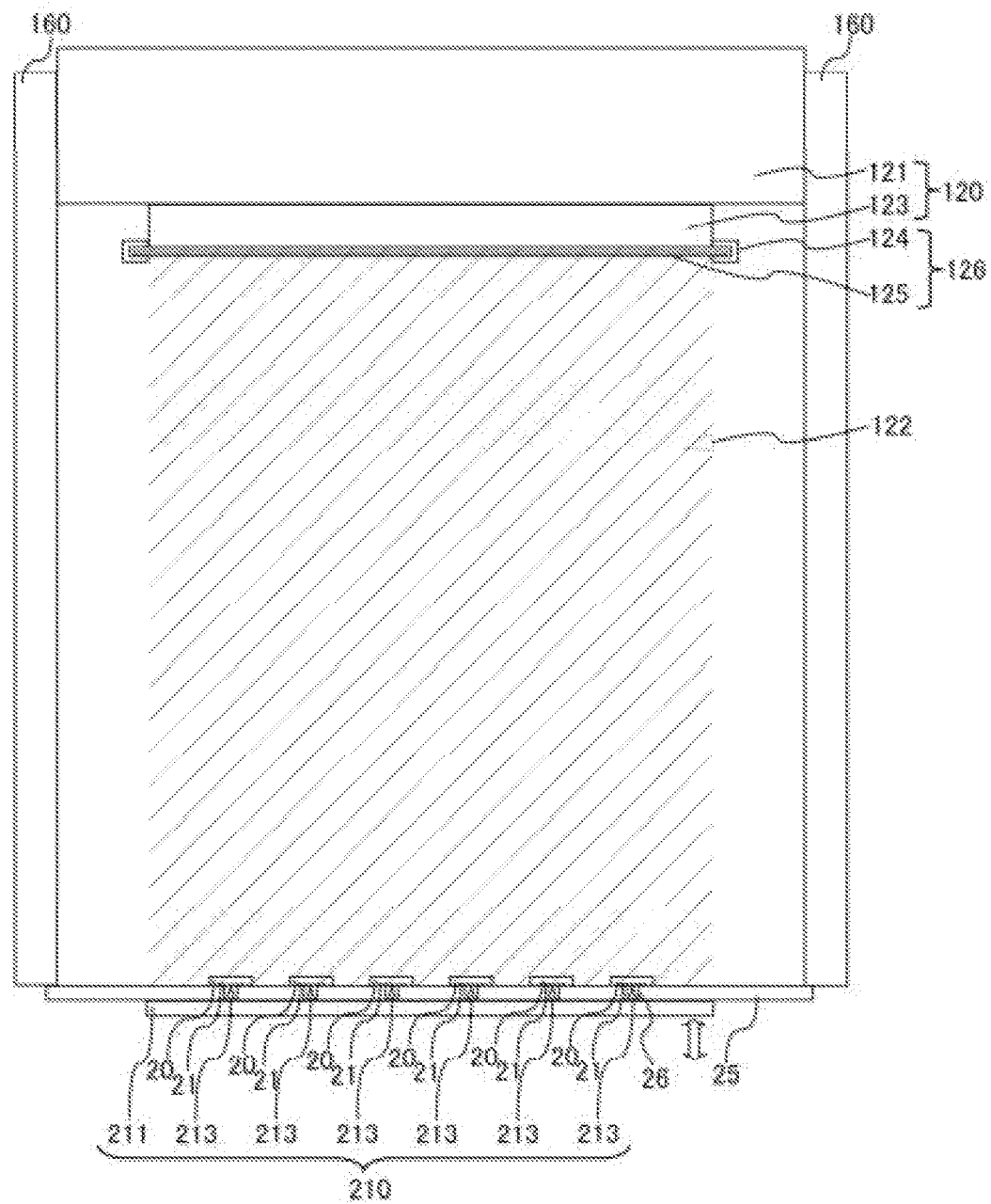
FIG. 7 is an example of an overall view illustrating an outline of a test apparatus 200 for testing a plurality of LEDs 20.

FIG. 7 is an example of an overall view illustrating an outline of a test apparatus 200 for testing a plurality of LEDs 20. In the description of the embodiment illustrated in FIG. 7, the same configurations as those of the embodiment described with reference to FIG. 1 to FIG. 6 are denoted by the corresponding reference numerals, and redundant description will be omitted. However, in FIG. 7, the measuring unit 130, the control unit 140, the storage unit 145, and the placement unit 150 of the test apparatus 100 described with reference to FIG. 1 to FIG. 6 will be not illustrated for the purpose of simply clarifying the description. The same applies to the drawings of the embodiments described below, and redundant description will be omitted.

In the embodiment described with reference to FIG. 1 to FIG. 6, the electrical connection unit 110 has been described as a configuration in which the electrical connection unit 110 is disposed between the light source unit 120 and the plurality of LEDs 10, and includes the substrate 111 and the plurality of probes 113 provided in the opening 112 of the substrate 111. In the embodiment illustrated in FIG. 7 and subsequent drawings, instead, an electrical connection unit 210 is disposed such that the plurality of LEDs 20 and 30 are located between the light source unit 120 and the electrical connection unit 210, and has a substrate 211 and a plurality of probes 213 extending from the substrate 211 toward each of the plurality of LEDs 20 and 30 and contacting terminals 21 and 31 of each of the plurality of LEDs 20 and 30.

In the embodiment illustrated in FIG. 7, the LED group is a surface emitting type in which the light emitting surfaces of the plurality of LEDs 20 do not face a wafer 25, each terminal 21 of the plurality of LEDs 20 faces the wafer 25, and the wafer 25 is formed with a plurality of vias 26 extending in the Z axis direction at the position of each terminal 21. In such a case, the electrical connection unit 210 may bring the plurality of probes 213 into contact with the respective terminals 21 of the plurality of LEDs 20 from the negative direction side of the Z axis of the wafer 25 through the plurality of vias 26 formed in the wafer 25.

In the electrical connection unit 210 of the embodiment illustrated in FIG. 7, the substrate 211 may not have the opening 112 of the electrical connection unit 110 in the embodiment described with reference to FIG. 1 to FIG. 6, and the plurality of probes 213 may not extend in the XY plane. As illustrated in FIG. 7, the plurality of probes 213 may extend in the Z axis direction toward the terminals 21 of each LED 20 so as to form a mountain shape together with the substrate 211. The same applies to the embodiments described below, and redundant description will be omitted.

Figure 8:
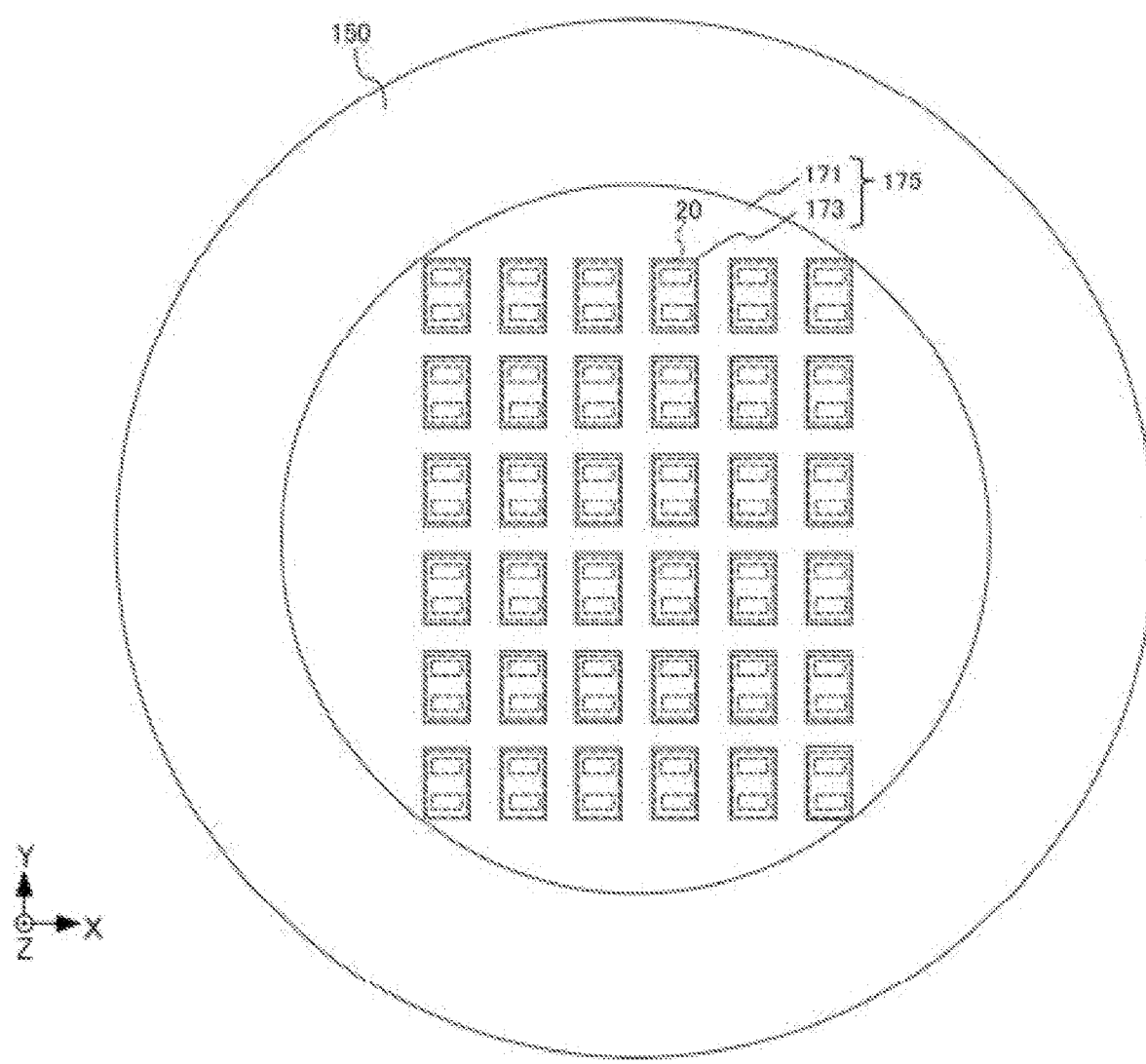
FIG. 8 is an example of a plan view of the placement unit 150 and a light intensity measurement unit 175 placed on the placement unit 150.

FIG. 8 is an example of a plan view of the placement unit 150 and the light intensity measurement unit 175 placed on the placement unit 150. The measuring unit 130 according to the present embodiment includes the light intensity measurement unit 175 instead of the light intensity measurement unit 170 in the embodiment described with reference to FIG. 1 to FIG. 6. The light intensity measurement unit 175 has the same number of sensors 173 as the number of the plurality of LEDs 20, and each of the plurality of sensors 173 is disposed at the same position as the position of each of the plurality of LEDs 20. Note that the light intensity measurement unit 175 may include a two-dimensional luminance meter for collectively measuring the intensity of light with which the position of each of the plurality of LEDs 20 instead of the sensors 173 having the same number as the plurality of LEDs 20 is irradiated.

Figure 9:
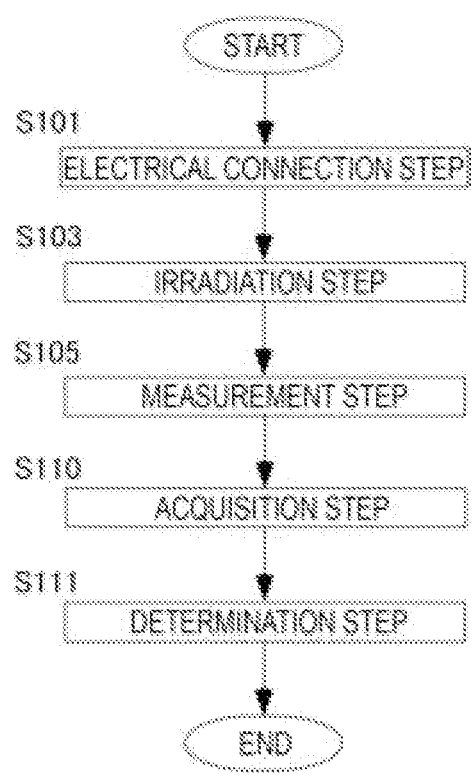
FIG. 9 is an example of a flowchart for explaining a flow of a test method by the test apparatus 200.

FIG. 9 is an example of a flowchart for explaining a flow of a test method by the test apparatus 200. The test apparatus 200 according to the present embodiment functions similarly to the test apparatus 100 according to the embodiment described with reference to FIG. 1 to FIG. 6, and executes Steps S101, S103, S105, S110, and S111 of the flow illustrated in FIG. 4. However, unlike the test apparatus 100 according to the embodiment described with reference to FIG. 1 to FIG. 6, the test apparatus 200 according to the present embodiment does not execute Steps S107 and S109 of the flow illustrated in FIG. 4.

Figure 10:
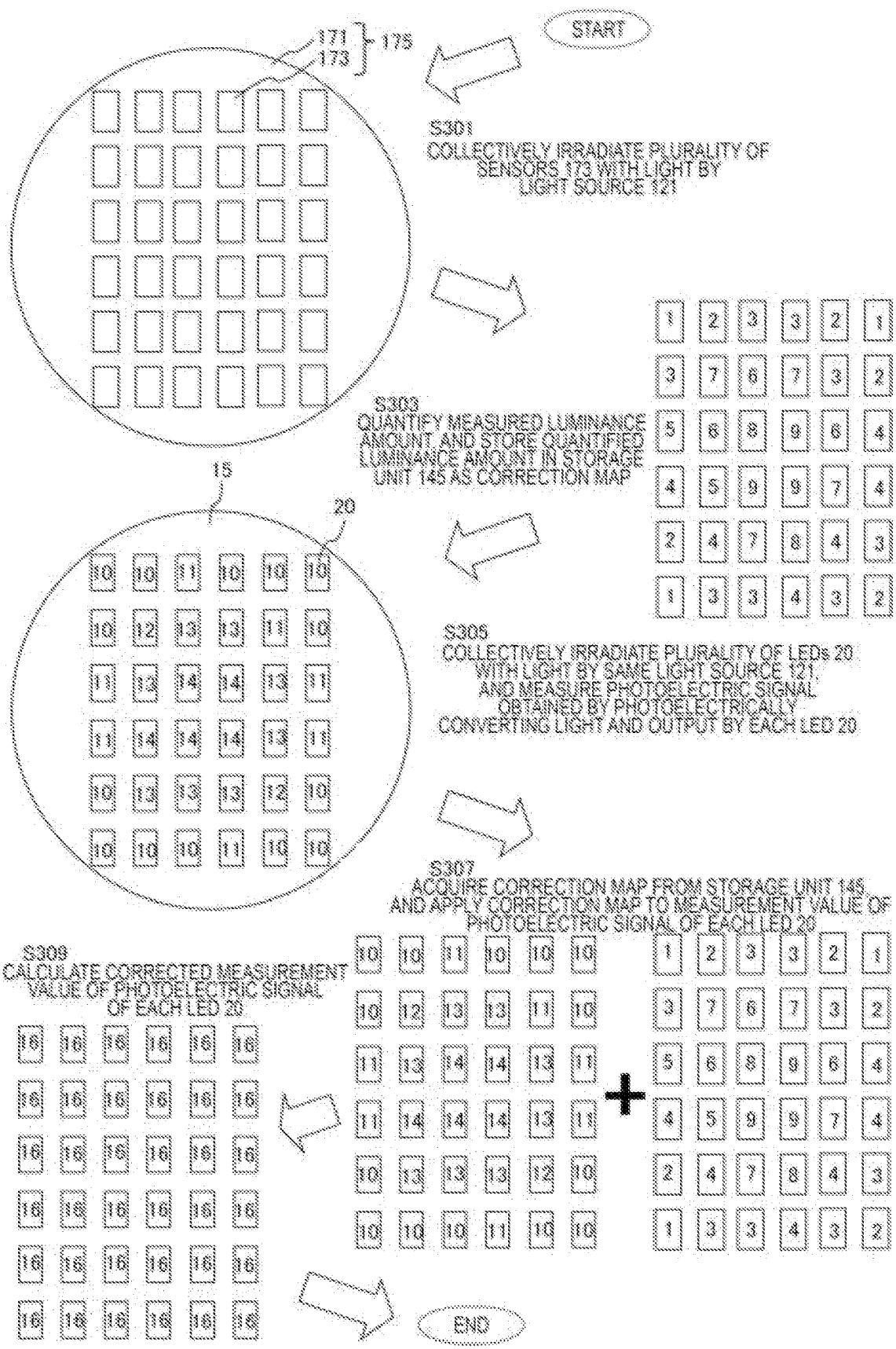
FIG. 10 is an example of a flowchart for explaining a flow of generating a correction map to calculate a corrected measurement value of the photoelectric signal of each LED 10 by the test apparatus 200.

FIG. 10 is an example of a flowchart for explaining a flow of generating the correction map and calculating the corrected measurement value of the photoelectric signal of each LED 20 by the test apparatus 200. Similarly to the flow illustrated in FIG. 5, the flow is started when, for example, the user performs an input for starting the flow with respect to the test apparatus 200 with the light intensity measurement unit 175 disposed on the placement unit 150.

The test apparatus 200 collectively irradiates the plurality of sensors 173 with light by the light source 121, and measures the luminance amount of each sensor 173 (Step S301). The test apparatus 200 quantifies the measured luminance amount and stores the quantified luminance amount in the storage unit 145 as data of the correction map as illustrated in FIG. 10 (Step S303).

The test apparatus 200 collectively irradiates the plurality of LEDs 20 with light by the same light source 121, and measures a photoelectric signal which is obtained by photoelectrically converting the light and output by each LED 20 (Step S305). The test apparatus 200 acquires the correction map from the storage unit 145, and applies the correction map to the measurement value of the photoelectric signal of each LED 20 (Step S307). The test apparatus 200 calculates the corrected measurement value of the photoelectric signal of each LED 20 (Step S309), and ends the flow.

Note that Step S305 in the flow corresponds to Steps S101 to S105 in the flow illustrated in FIG. 9, and Steps S307 and S309 in the flow correspond to Steps S110 to S111 in the flow illustrated in FIG. 9. The corrected measurement value calculated in the flow is used in the determination in Step S111 illustrated in FIG. 9.

Figure 11:
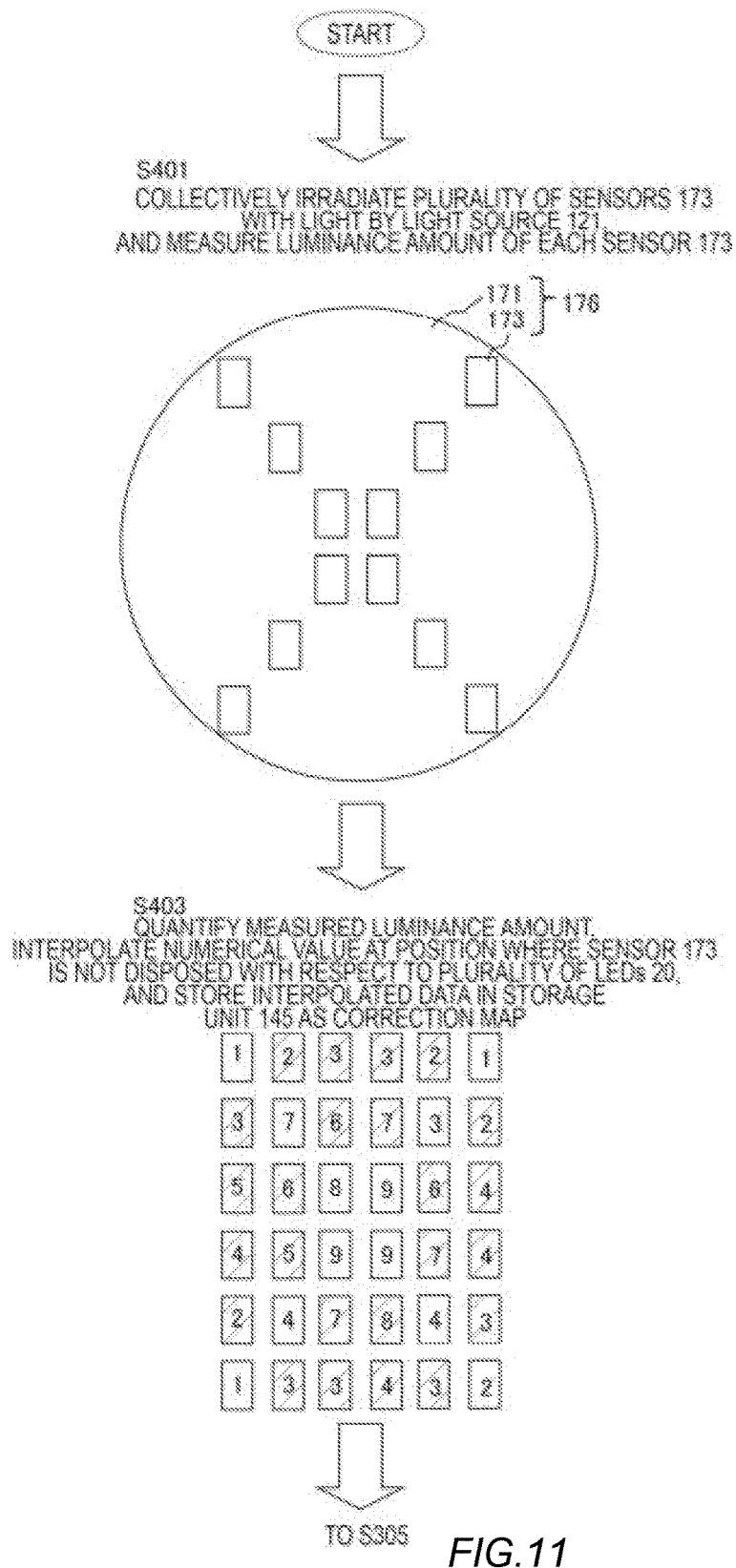
FIG. 11 is another example of a flowchart for explaining a flow of generating a correction map to calculate a corrected measurement value of the photoelectric signal of each LED 10 by the test apparatus 200.

FIG. 11 is another example of a flowchart for explaining a flow of generating the correction map and calculating the corrected measurement value of the photoelectric signal of each LED 20 by the test apparatus 200. The measuring unit 130 according to the present embodiment includes a light intensity measurement unit 176 instead of the light intensity measurement unit 175 in the embodiment described with reference to FIG. 10.

The measuring unit 130 according to the present embodiment measures the intensity of light with which the positions of several LEDs 20 are irradiated, which is a part of the light with which the position of each of the plurality of LEDs 20 is irradiated by the light source unit 120. The light intensity measurement unit 176 of the measuring unit 130 according to the present embodiment has a smaller number of sensors 173 than the plurality of LEDs 20, and the plurality of sensors 173 each are disposed at the positions of the several LEDs 20 described above. The plurality of sensors 173 are separated from each other by a predetermined interval, for example, as illustrated in FIG. 11. The light intensity measurement unit 176 can reduce the number of sensors 173 as compared with the light intensity measurement unit 175. Note that the arrangement of the plurality of sensors 173 illustrated in FIG. 11 is merely an example, and other arrangements may be adopted.

Note that the light intensity measurement unit 176 may include a two-dimensional luminance meter for collectively measuring the intensity of light with which the positions of several LEDs 20 are irradiated instead of the smaller number of sensors 173 than the plurality of LEDs 20. The number of pixels of the two-dimensional luminance meter may be smaller than the number of pixels of another two-dimensional luminance meter for collectively measuring the intensity of light with which the position of each of the plurality of LEDs 20 is irradiated.

Similarly to the flow illustrated in FIG. 10, the flow illustrated in FIG. 11 is started when, for example, the user performs an input for starting the flow with respect to the test apparatus 200 with the light intensity measurement unit 176 disposed on the placement unit 150.

The test apparatus 200 collectively irradiates the plurality of sensors 173 with light by the light source 121, and measures the luminance amount of each sensor 173 (Step S401).

The control unit 140 in the present embodiment interpolates the intensities of the lights with which the positions of the rest LEDs 20 other than the several LEDs 20 described above are irradiated among the plurality of LEDs 20 on the basis of the measurement results of the plurality of sensors 173 by the measuring unit 130, and generates the correction map. Specifically, the test apparatus 200 quantifies the luminance amount measured in Step S401, calculates a correction coefficient from the quantified data, and interpolates the numerical values at the positions where the sensor 173 is not disposed with respect to the plurality of LEDs 20 using the correction coefficient. The test apparatus 200 stores the interpolated data in the storage unit 145 as a correction map (Step S403), and proceeds to Step S305 of the flow illustrated in FIG. 10.

Figure 12:
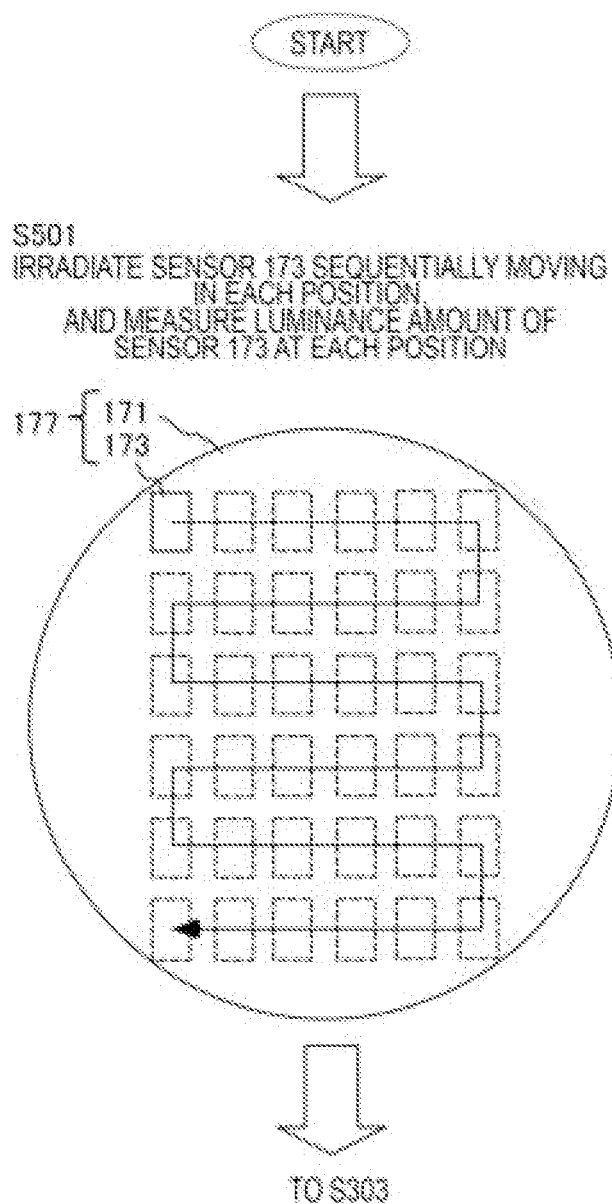
FIG. 12 is still another example of a flowchart for explaining a flow of generating a correction map to calculate a corrected measurement value of the photoelectric signal of each LED 10 by the test apparatus 200.

FIG. 12 is still another example of a flowchart illustrating a flow of generating the correction map and calculating the corrected measurement value of the photoelectric signal of each LED 20 by the test apparatus 200. The measuring unit 130 according to the present embodiment includes a light intensity measurement unit 177 instead of the light intensity measurement unit 176 in the embodiment described with reference to FIG. 11.

The light intensity measurement unit 177 of the measuring unit 130 according to the present embodiment sequentially measures the intensity of the light with which the position of each of the plurality of LEDs 20 is irradiated by the light source unit 120 by sequentially moving the position of each of the plurality of LEDs 20. The light intensity measurement unit 177 has one sensor 173, and the sensor 173 is movable on the surface of the holding unit 171. The light intensity measurement unit 177 can further reduce the number of sensors 173 as compared with the light intensity measurement units 175 and 176, and the like. Note that the movement path of the sensor 173 indicated by an arrow in FIG. 12 is merely an example, and may be another movement path.

Similarly to the flow illustrated in FIG. 11, the flow illustrated in FIG. 12 is started when, for example, the user performs an input for starting the flow with respect to the test apparatus 200 with the light intensity measurement unit 177 disposed on the placement unit 150.

The test apparatus 200 irradiates the sensor 173 sequentially moving in the position of each of the plurality of LEDs 20 with light by the light source 121, measures the luminance amount of the sensor 173 at each position (Step S501), and proceeds to Step S303 of the flow illustrated in FIG. 10.

The test apparatus 200 according to the embodiment described above has the same effect as the test apparatus 100 according to the embodiment described with reference to FIG. 1 to FIG. 6. Since the test apparatus 200 includes the electrical connection unit 210 having a configuration in which the plurality of probes 213 extend in the Z axis direction from one surface of the substrate 211 having no opening toward the terminal 21 of each LED 20, the number of probes 213 can be increased and the number of LEDs 20 to be measured at the same time can be increased as compared with the case of using the electrical connection unit 110 having the plurality of probes 113 extending toward the terminal 11 of the LED 20 exposed in the opening 112 of the substrate 111 according to the embodiment described with reference to FIG. 1 to FIG. 6.

Note that, in the present embodiment, the placement unit 150 on which the LED group is placed is moved so that the position coordinates of the plurality of probes 113 of the electrical connection unit 110 and the position coordinates of the plurality of LEDs 20 of the LED group coincide with each other in the XY plane, and then the substrate 211 of the electrical connection unit 210 is moved up and down as indicated by a white arrow in each drawing, whereby the plurality of terminals 21 of the plurality of LEDs 20 may be brought into contact with the plurality of probes 213.

In the present embodiment, the configuration illustrated in FIG. 7 may be reversed in the Z axis direction, and thus the plurality of LEDs 20 may be irradiated, from the negative direction of the Z axis, with the parallel light 122 from the light source unit 120.

In the present embodiment, in order to prevent the wafer 25 from being deformed by the pressing of the electrical connection unit 210 by the plurality of probes 213, a support plate that transmits light, such as glass, may be interposed between the wafer 25 and the blocking unit 160. In a case where the plurality of LEDs 20 are located on the light source unit 120 side as illustrated in FIG. 7, it is preferable that the support plate is configured not to contact the plurality of LEDs 20 so as not to destroy the plurality of LEDs 20 formed on the wafer 25. Any of the points described above is similar in a plurality of embodiments described below, and redundant description will be omitted.

Note that, in the test apparatuses 100 and 200 according to the above embodiments, the description has been given that the control unit 140 is configured to generate the correction map using the holding unit 171 that holds one or more sensors 173 or the luminance meter instead of the wafers 15 and 25 that hold the plurality of LEDs 10 and 20. Alternatively, the control unit 140 may generate the correction map on the basis of an average value of the photoelectric signals output by the LEDs 10 and 20 disposed at the same position between the sets of the plurality of LEDs 10 and 20 in the measurement results obtained by performing a plurality of measurements by the measuring unit 130 while sequentially changing the set of the plurality of LEDs 10 and 20 to be tested from the LED group.

For example, when the number of wafers 15 and 25 to be tested is, for example, 30, the photoelectric signals of 30 wafers 15 and 25 may be measured, an average value of the photoelectric signals output by the LEDs 10 and 20 disposed at the same position between the sets of the plurality of LEDs 10 and 20 may be calculated, and the above described correction map may be generated on the basis of the average value.

As a result, the test apparatuses 100 and 200 can omit the configuration of the light intensity measurement unit 170 and the like.

In this case, among the measurement values of the photoelectric signals output by the LEDs 10 and 20 disposed at the same position between the sets of the plurality of LEDs 10 and 20, for example, the measurement values that are significantly abnormal compared to the others, such as the measurement values of the photoelectric signals output by the defective LEDs 10 and 20, may be excluded. For the exclusion, a predetermined threshold value for the measurement value may be used. As a result, the calculation accuracy of the average value described above can be enhanced.

Figure 13:
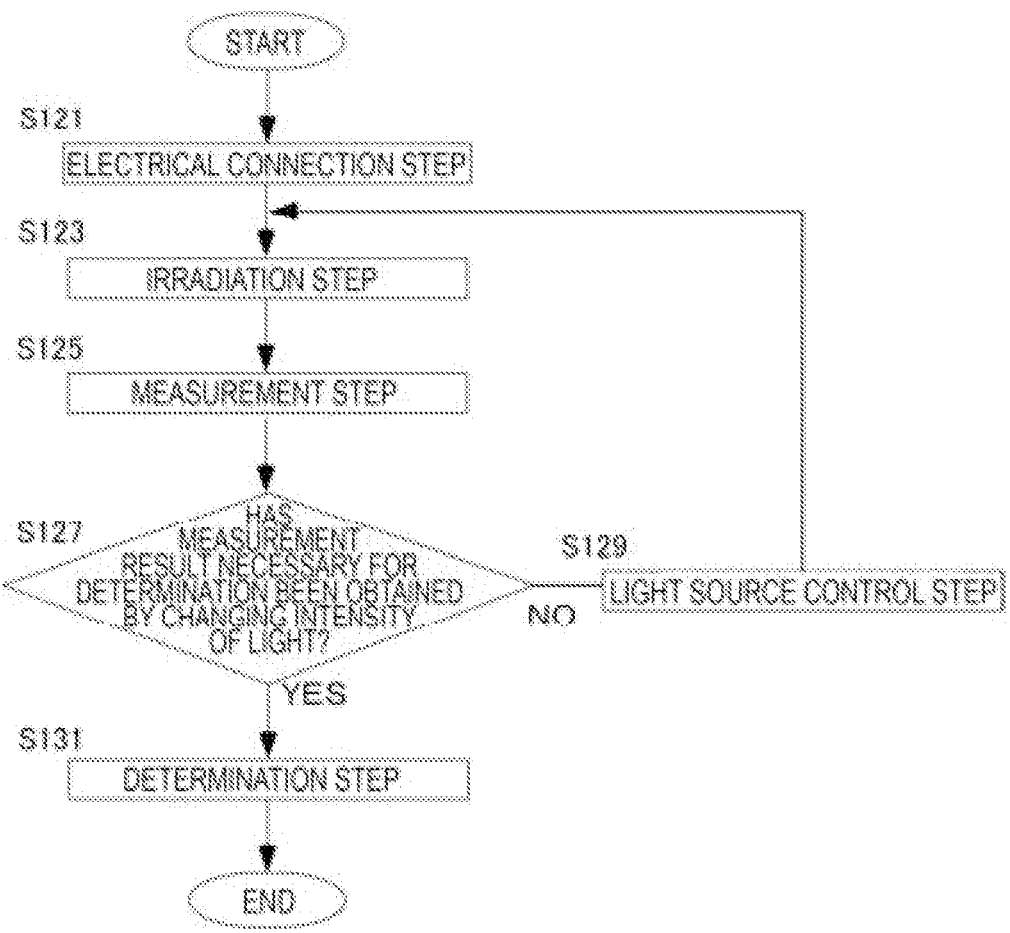
FIG. 13 is another example of a flowchart for explaining a flow of a test method by the test apparatus 200.

FIG. 13 is another example of a flowchart for explaining the flow of the test method by the test apparatus 200. The control unit 140 of the test apparatus 200 according to the present embodiment additionally or alternatively changes the intensity of the light irradiated by the light source unit 120, and determines the quality of each of the plurality of LEDs 20 on the basis of the measurement result by the measuring unit 130 in a case where the intensity is changed. In other words, the control unit 140 changes the intensity of the light irradiated by the light source unit 120, and determines the response of each LED 20 to the change in the intensity of the light. Note that the control unit 140 according to the present embodiment functions as an example of a light source control unit.

The LED 20 emits stronger light as the current value to be applied is higher, but there is an individual difference, and when the current value is low, characteristics cannot be fully exhibited, that is, light cannot be appropriately emitted in some cases. Therefore, in the case of causing the LED 20 to perform photoelectric conversion, it can be regarded that the LED 20 is capable of appropriately emitting light even at a low current value as long as an appropriate reaction, that is, an appropriate photoelectric signal is output even when the LED 20 is irradiated with weak light.

Similarly to the flow illustrated in FIG. 4, the flow illustrated in FIG. 13 is started when, for example, the user performs an input for starting the test of the LED group with respect to the test apparatus 200 with the LED group placed on the placement unit 150. The test apparatus 200 executes Steps S101, S103, and S105 corresponding to Steps S121, S123, and S125 in the flow illustrated in FIG. 4.

The test apparatus 200 determines whether the measurement result necessary for determining the quality of each of the plurality of LEDs 20 on the wafer 25 is obtained by changing the intensity of light (Step S127), and if not obtained (Step S127: NO), the light source control step of changing the intensity of the light irradiated in the irradiation step of Step S123 is executed (Step S129), and the process returns to Step S123. As a specific example, the control unit 140 may refer to the reference data in the storage unit 145 and determine whether a measurement result in a case where the plurality of LEDs 20 are irradiated with light having an intensity equal to or higher than a predetermined threshold value and a measurement result in a case where the plurality of LEDs 20 are irradiated with light having an intensity equal to or lower than the predetermined threshold value are stored. In a case where at least one of these measurement results is not stored in the storage unit 145, the control unit 140 changes the intensity of light irradiated from the light source unit 120 and irradiates the plurality of LEDs 20 with light again.

In a case where the measurement result necessary for determining the quality of each of the plurality of LEDs 20 on the wafer 25 is obtained in Step S127 (Step S127: YES), the test apparatus 200 executes the determination step of determining the quality of each of the plurality of LEDs 20 on the basis of the measurement result of the measurement step in a case where the intensity is changed in the light source control step of Step S129 (Step S131), and the flow ends.

The test apparatus 200 according to the embodiment described above has the same effects as the test apparatuses 100 and 200 according to the plurality of embodiments described with reference to FIG. 1 to FIG. 12. For example, the control unit 140 in the present embodiment may calculate a photoelectric gain of each of the plurality of LEDs 20 on the basis of the measurement result of each of two or more different intensities. In this case, control unit 140 may determine that at least one LED 20 of which the photoelectric gain is out of the normal range among the plurality of LEDs 20 is defective. More specifically, the control unit 140 may determine that at least one LED 20 of which the photoelectric gain is out of the normal range at any of two or more different intensities is defective.

For example, the control unit 140 in the present embodiment may determine that at least one LED 20 in which the photoelectric signal measured at each of two or more different intensities among the plurality of LEDs 20 is out of the normal range is defective. More specifically, the control unit 140 may determine that at least one LED 20 in which the photoelectric signal is out of the normal range at any of two or more different intensities is defective.

Figure 14:
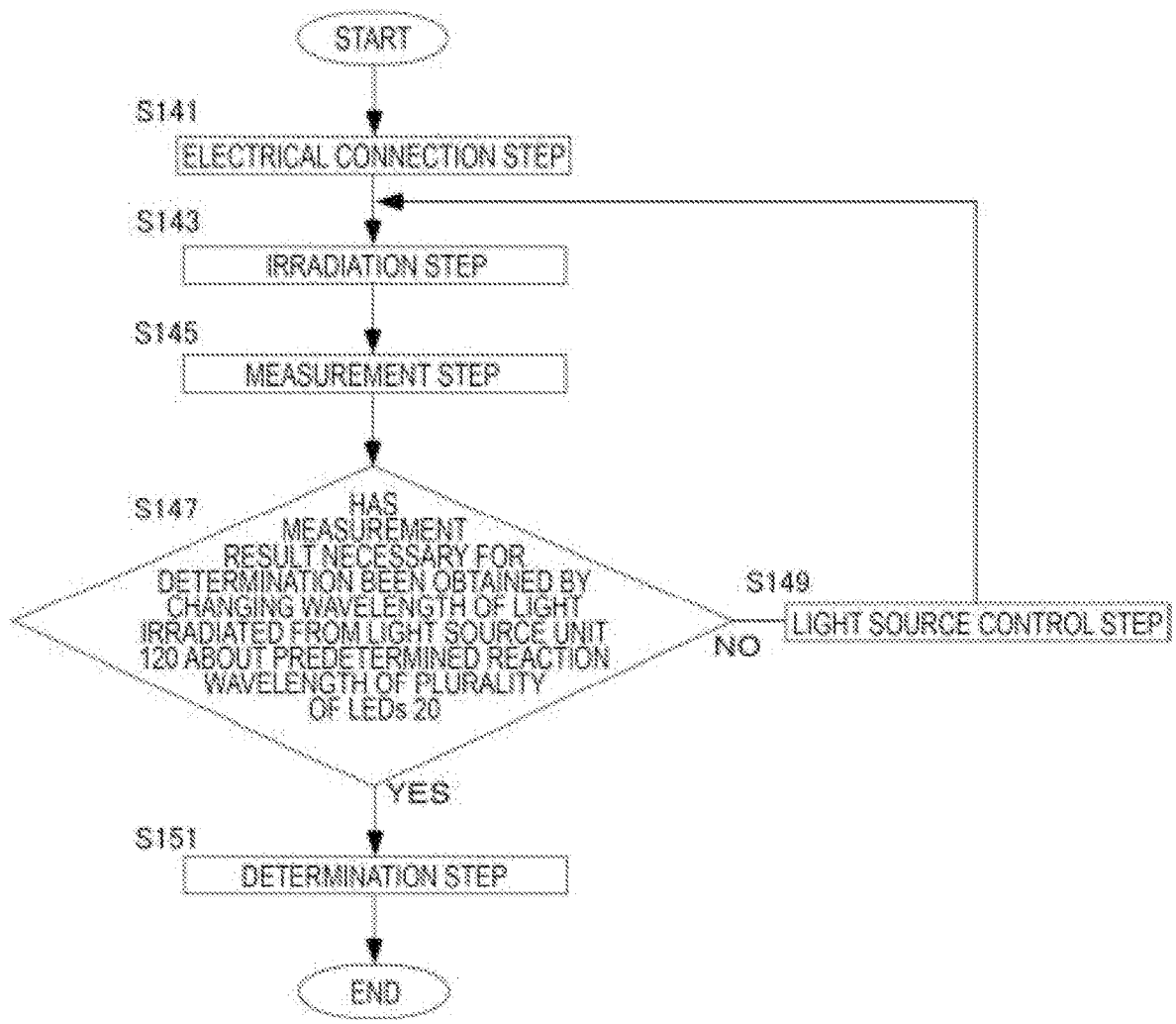
FIG. 14 is still another example of a flowchart for explaining a flow of a test method by the test apparatus 200.

FIG. 14 is still another example of a flowchart for explaining the flow of the test method by the test apparatus 200. Additionally or alternatively, the control unit 140 of the test apparatus 200 according to the present embodiment changes the wavelength of the light irradiated by the light source unit 120 within a predetermined range including a predetermined reaction wavelength of the plurality of LEDs 20, and determines the quality of each of the plurality of LEDs 20 on the basis of the measurement result by the measuring unit 130 in a case where the wavelength is changed. In other words, the control unit 140 changes the wavelength of the light irradiated by the light source unit 120 within a predetermined range including a predetermined reaction wavelength of the plurality of LEDs 20, and determines the reaction of each LED 20 to the wavelength change of the light.

In the LED 10 in which the light emission wavelength is shifted to be defective, the peak of the reaction to the light from the light source 121 is also shifted. Therefore, the test apparatus 200 additionally has a function of shifting the wavelength of the light irradiated by the light source 121, that is, a wavelength selection function. As a specific example, in a case where the light source 121 is a light source having a wide wavelength band, for example, a xenon light source, the test apparatus 200 may have a configuration in which a spectroscope using, for example, a slit is installed on the light output side (front end) of the light source 121 to spectrally separate light from the light source 121 and transmit only light having a specific wavelength. As another example, in a case where the light source 121 is a laser light source having a narrow wavelength band, the test apparatus 200 may include a diffraction grating or the like at the front end of the light source 121. As another example, the light source 121 may include a plurality of laser light sources having a narrow wavelength band.

The control unit 140 sweeps the wavelength of the light from the light source 121, for example, in one nanostep from 350 nm to 400 nm, and determines which wavelength each LED 10 reacts with, thereby determining the light emission wavelength of each LED 10.

Similarly to the flow illustrated in FIG. 4, the flow illustrated in FIG. 14 is started when, for example, the user performs an input for starting the test of the LED group with respect to the test apparatus 200 with the LED group placed on the placement unit 150. The test apparatus 200 executes Steps S101, S103, and S105 corresponding to Steps S141, S143, and S145 in the flow illustrated in FIG. 4.

The test apparatus 200 changes the wavelength of the light within a predetermined range including a predetermined reaction wavelength of the plurality of LEDs 20, determines whether a measurement result necessary for determining the quality of each of the plurality of LEDs 20 on the wafer 25 is obtained (Step S147), and if not obtained (Step S147: NO), executes the light source control step of changing the wavelength of the light irradiated in the irradiation step of Step S143 within a predetermined range including a predetermined reaction wavelength of the plurality of LEDs 20 (Step S149), and returns to Step S143. As a specific example, the control unit 140 may refer to the reference data in the storage unit 145 and determine whether measurement results in a case where the plurality of LEDs 20 are irradiated with light of a predetermined number of different wavelengths centered on design reaction wavelengths of the plurality of LEDs 20 are stored. In a case where the measurement result based on the light having the predetermined number or more of different wavelengths is not stored in the storage unit 145, the control unit 140 shifts the wavelength of the light irradiated from the light source unit 120 by, for example, a predetermined wavelength width, and irradiates the plurality of LEDs 20 with light again.

In a case where the measurement result necessary for determining the quality of each of the plurality of LEDs 20 on the wafer 25 is obtained in Step S147 (Step S147: YES), the test apparatus 200 executes the determination step of determining the quality of each of the plurality of LEDs 20 on the basis of the measurement result of the measurement step in a case where the wavelength is changed in the light source control step of Step S149 (Step S151), and the flow ends.

The test apparatus 200 according to the embodiment described above has the same effects as the test apparatuses 100 and 200 according to the plurality of embodiments described with reference to FIG. 1 to FIG. 13. For example, the control unit 140 in the present embodiment may calculate the photoelectric gain of each of the plurality of LEDs 20 on the basis of the measurement result at each of two or more different wavelengths. In this case, control unit 140 may determine that at least one LED 20 of which the photoelectric gain is out of the normal range among the plurality of LEDs 20 is defective. More specifically, the control unit 140 may determine that at least one LED 20 of which the photoelectric gain is out of the normal range at any of two or more different wavelengths is defective.

For example, the control unit 140 in the present embodiment may determine that at least one LED 20 in which the photoelectric signal measured at each of two or more different wavelengths among the plurality of LEDs 20 is out of the normal range is defective. More specifically, the control unit 140 may determine that at least one LED 20 in which the photoelectric signal is out of the normal range at any of two or more different wavelengths is defective.

Figure 15:
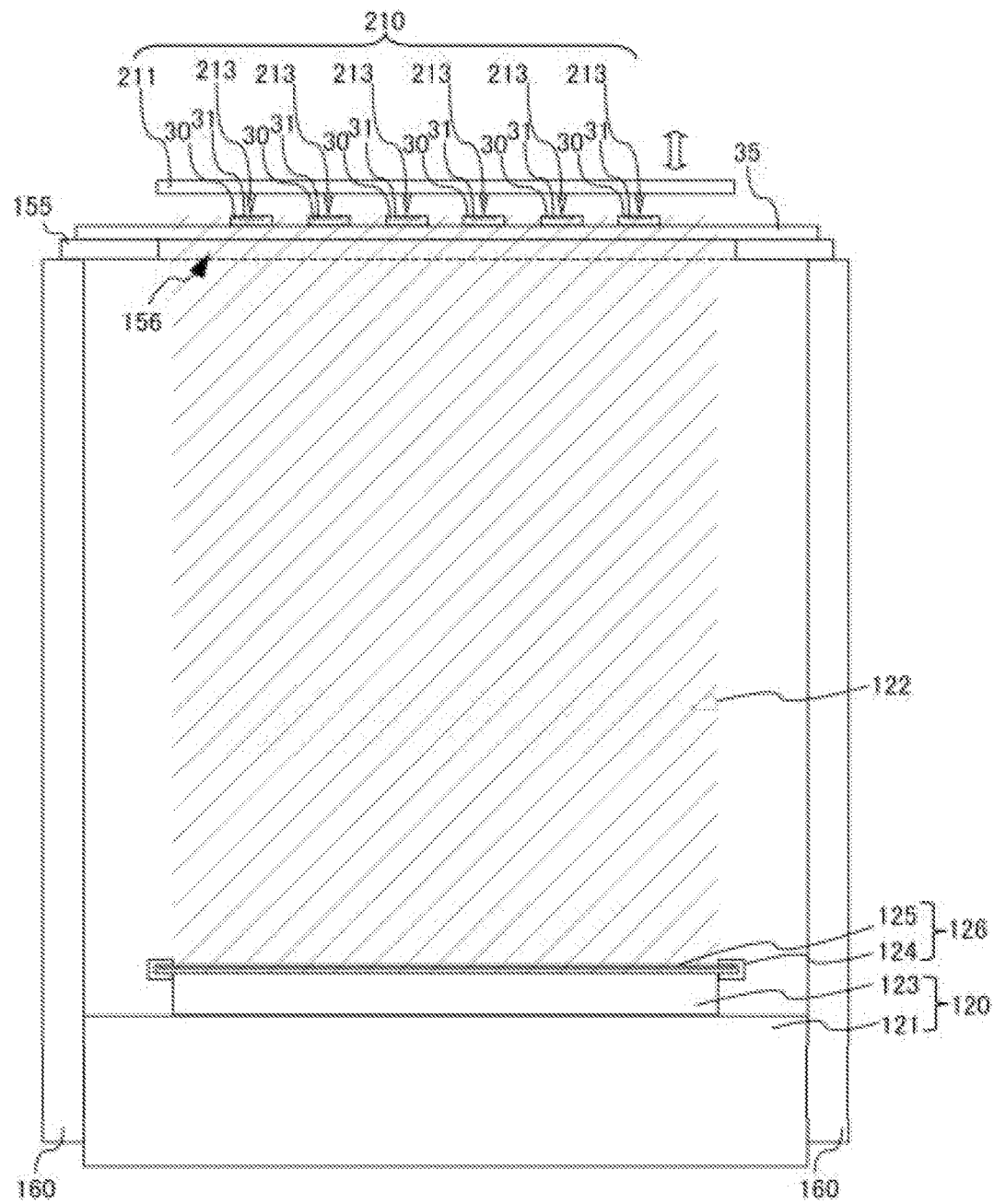
FIG. 15 is an example of an overall view illustrating an outline of a test apparatus 300 for testing a plurality of LEDs 30.

FIG. 15 is an example of an overall view illustrating an outline of a test apparatus 300 for testing a plurality of LEDs 30. Unlike the test apparatuses 100 and 200, the test apparatus 300 has a posture in which the entire test apparatus 200 is inverted in the Z axis direction. In the embodiment illustrated in FIG. 15, the LED group is a back-side emission type in which the light emitting surfaces of the plurality of LEDs 30 face a wafer 35, and the wafer 35 transmits light. Each terminal 31 of the plurality of LEDs 30 does not face the wafer 35. Note that, in the LED group of a back-side emission type as in the present embodiment, the plurality of LEDs 30 and the wafer 35 on which the plurality of LEDs 30 are mounted may be collectively referred to as a wafer.

In such a configuration, the electrical connection unit 210 brings the plurality of probes 213 into contact with the respective terminals 31 of the plurality of LEDs 30 from the positive direction side of the Z axis of the wafer 35. In the embodiment illustrated in FIG. 15, unlike the placement unit 150, the placement unit 155 has a light transmission unit 156 at the center of the XY plane so as not to block the light irradiated by the plurality of LEDs 30 and transmitted through the wafer 35, and holds the wafer 35 around the light transmission unit 156. As an example, the light transmission unit 156 may be a simple through hole, or may have a configuration in which a member that transmits light such as glass is fitted in the through hole. The test apparatus 300 of the embodiment illustrated in FIG. 15 has the same effect as the test apparatuses 100 and 200 of the plurality of embodiments described with reference to FIG. 1 to FIG. 14.

In the plurality of embodiments described above, in a case where the LED group has a configuration in which the plurality of LEDs are formed on a glass-based panel (PLP) having a substantially rectangular outer shape on which electric wirings are formed, the electrical connection unit may have a configuration in which the probes are brought into contact with the respective wirings in the row direction and the column direction arranged on the two side surfaces of the panel.

Various embodiments of the present invention may also be described with reference to flowcharts and block diagrams, where the blocks may represent (1) a step of processing in which an operation is executed or (2) a section of an apparatus that is responsible for executing the operation. Certain steps and sections may be implemented by dedicated circuitry, programmable circuitry provided with computer readable instructions stored on a computer readable medium, and/or a processor provided with computer readable instructions stored on a computer readable medium. The dedicated circuitry may include digital and/or analog hardware circuits, and may include integrated circuits (ICs) and/or discrete circuits. The programmable circuitry may include reconfigurable hardware circuits including memory elements such as logic AND, logic OR, logic XOR, logic NAND, logic NOR, and other logic operations, flip-flops, registers, field programmable gate arrays (FPGA), programmable logic arrays (PLA), and the like.

The computer readable medium may include any tangible device capable of storing instructions to be executed by a suitable device, so that the computer readable medium having the instructions stored therein will have a product including instructions that can be executed to create means for executing the operations specified in flowcharts or block diagrams. Examples of the computer readable medium may include an electronic storage medium, a magnetic storage medium, an optical storage medium, an electromagnetic storage medium, a semiconductor storage medium, and the like. More specific examples of the computer readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer readable instructions may include source code or object code written in any combination of one or more programming languages, including assembler instructions, instruction-set-architecture (ISA) instructions, machine instructions, machine-dependent instructions, microcode, firmware instructions, state-setting data, or an object oriented programming language such as Smalltalk (registered trademark), JAVA (registered trademark), C++, or the like, and conventional procedural programming languages such as the "C" programming language or similar programming languages.

The computer readable instructions may be provided for a processor or programmable circuitry of a general purpose computer, special purpose computer, or other programmable data processing apparatuses locally or via a wide area network (WAN) such as a local area network (LAN), the Internet, or the like, and execute the computer readable instructions to create means for executing the operations specified in flowcharts or block diagrams. Examples of the processor include a computer processor, a processing unit, a microprocessor, a digital signal processor, a controller, a microcontroller, and the like.

Figure 16:
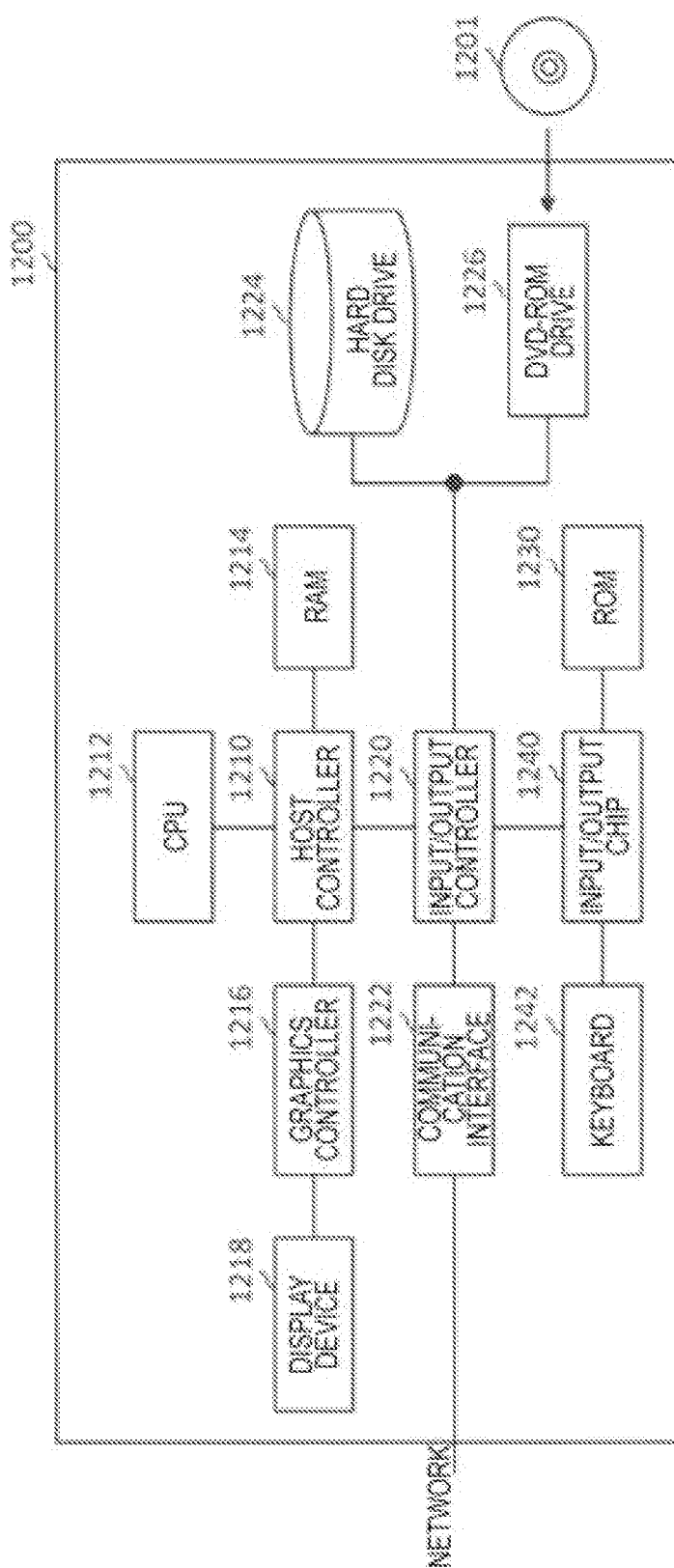
FIG. 16 is a diagram illustrating an example of a computer 1200 in which a plurality of aspects of the present invention may be embodied in whole or in part.

FIG. 16 illustrates an example of a computer 1200 in which a plurality of aspects of the present invention may be embodied in whole or in part. A program installed in the computer 1200 can cause the computer 1200 to function as an operation associated with the apparatus according to the embodiment of the present invention or one or more "units" of the apparatus, or execute the operation to the one or more "units", and/or cause the computer 1200 to execute a process according to the embodiment of the present invention or a step of the processing. Such programs may be executed by a CPU 1212 to cause the computer 1200 to execute certain operations associated with some or all of the blocks in the flowcharts and block diagrams described in the present specification.

The computer 1200 according to the present embodiment includes the CPU 1212, a RAM 1214, a graphics controller 1216, and a display device 1218, which are interconnected by a host controller 1210. The computer 1200 also includes input/output units such as a communication interface 1222, a hard disk drive 1224, a DVD-ROM drive 1226, and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates according to programs stored in the ROM 1230 and the RAM 1214, thereby controlling each unit. The graphics controller 1216 acquires image data generated by the CPU 1212 in a frame buffer or the like provided in the RAM 1214 or in the graphics controller 1216 itself, such that the image data is displayed on the display device 1218.

The communications interface 1222 communicates with other electronic devices via a network. The hard disk drive 1224 stores programs and data used by the CPU 1212 in the computer 1200. The DVD-ROM drive 1226 reads program or data from the DVD-ROM 1201 and provides the programs or data to the hard disk drive 1224 via the RAM 1214. The IC card drive reads programs and data from the IC card and/or writes the programs and data to the IC card.

The ROM 1230 stores a boot program and the like, therein, executed by the computer 1200 at the time of activation and/or a program depending on hardware of the computer 1200. The input/output chip 1240 may also connect various input/output units to the input/output controller 1220 via a parallel port, a serial port, a keyboard port, a mouse port, or the like.

The program is provided by a computer-readable storage medium such as a DVD-ROM 1201 or an IC card. The program is read from a computer-readable storage medium, installed in the hard disk drive 1224, the RAM 1214, or the ROM 1230 that are also examples of the computer-readable storage medium, and executed by the CPU 1212. The information processing described in these programs is read by the computer 1200 and provides cooperation between the programs and various types of hardware resources described above. The apparatus or method may be configured by implementing operation or processing of information according to the use of the computer 1200.

For example, in a case where communication is executed between the computer 1200 and an external device, the CPU 1212 may perform a communication program loaded in the RAM 1214 and instruct the communication interface 1222 to execute communication processing on the basis of a process described in the communication program. Under the control of the CPU 1212, the communication interface 1222 reads transmission data stored in a transmission buffer area provided in a recording medium such as the RAM 1214, the hard disk drive 1224, the DVD-ROM 1201, or the IC card, transmits the read transmission data to the network, or writes reception data received from the network in a reception buffer area or the like provided on the recording medium.

In addition, the CPU 1212 may cause the RAM 1214 to read all or a necessary part of a file or database stored in an external recording medium such as the hard disk drive 1224, the DVD-ROM drive 1226 (DVD-ROM 1201), the IC card, or the like, and may execute various types of processing on data on the RAM 1214.

Next, the CPU 1212 may write back the processed data to the external recording medium.

Various types of information such as various types of programs, data, tables, and databases may be stored in a recording medium in order to be subjected to information processing. The CPU 1212 may execute various types of processing on the data read from the RAM 1214, including various types of operations, information processing, conditional determination, conditional branching, unconditional branching, information retrieval/replacement, and the like, which are described throughout the present disclosure and specified by a command sequence of a program, and writes back the results to the RAM 1214. Further, the CPU 1212 may retrieve information in a file, a database, or the like in the recording medium. For example, in a case where a plurality of entries each having the attribute value of a first attribute associated with the attribute value of a second attribute is stored in the recording medium, the CPU 1212 may retrieve an entry matching the condition in which the attribute value of the first attribute is specified from among the plurality of entries, read the attribute value of the second attribute stored in the entry, and thereby acquire the attribute value of the second attribute associated with the first attribute satisfying the predetermined condition.

The programs or software modules according to the above description may be stored in a computer-readable storage medium on or near the computer 1200. In addition, a recording medium such as a hard disk or a RAM provided in a server system connected to a dedicated communication network or the Internet can be used as a computer-readable storage medium, thereby providing a program to the computer 1200 via the network.

While the embodiments of the present invention have been described, the technical scope of the invention is not limited to the above described embodiments. It is apparent to those skilled in the art that various modifications or improvements can be made to the above described embodiments. In addition, the matters described for a specific embodiment can be applied to other embodiments within a scope not technically contradictory. In addition, each component may have a similar feature to other component having the same name and different reference signs. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10, 20, 30: LED
11, 21, 31: terminal
15, 25, 35: wafer
100, 200, 300: test apparatus
110, 210: electrical connection unit
111, 211: substrate
112: opening
113, 213: probe
120: light source unit
121: light source
122: parallel light
123: lens unit
124: filter holding unit
125: temperature suppression filter
126: temperature control unit
130: measuring unit
140: control unit
145: storage unit
150, 155: placement unit
156: light transmission unit
160: blocking unit
170, 175, 176, 177: light intensity measurement unit
171: holding unit
173: sensor
1200: computer
1201: DVD-ROM
1210: host controller
1212: CPU
1214: RAM
1216: graphics controller
1218: display device
1220: input/output controller
1222: communication interface
1224: hard disk drive
1226: DVD-ROM drive
1230: ROM
1240: input/output chip
1242: keyboard

What is claimed is:

1. A test apparatus comprising:
an electrical connection unit configured to be electrically connected to a terminal of each of a plurality of light emitting devices to be tested;
a light source unit configured to collectively irradiate the plurality of light emitting devices with light;
a measuring unit configured to measure a photoelectric signal which is obtained by photoelectrically converting the light irradiated by the light source unit and output via the electrical connection unit by each of the plurality of light emitting devices;
an acquisition unit configured to acquire a correction map including a correction value for correcting a variation in intensity of light with which a position of each of the plurality of light emitting devices is irradiated by the light source unit; and
a determination unit configured to determine a quality of each of the plurality of light emitting devices on a basis of a measurement result by the measuring unit and the correction map acquired by the acquisition unit;
a second measuring unit configured to measure an intensity of light with which a position of each of the plurality of light emitting devices is irradiated by the light source unit; and
a generation unit configured to generate the correction map on a basis of a second measurement result by the second measuring unit.

2. The test apparatus according to claim 1, wherein the determination unit is configured to:
correct a measurement value of the photoelectric signal measured for each of the plurality of light emitting devices by the measuring unit using the correction value for the position of each of the plurality of light emitting devices in the correction map, and determine the quality of each of the plurality of light emitting devices on a basis of the measurement value of the photoelectric signal that has been corrected.

3. The test apparatus according to claim 1, wherein the determination unit is configured to determine at least one light emitting device in which a correction value obtained by correcting the measured photoelectric signal by the correction map is out of a normal range among the plurality of light emitting devices as defective.

4. The test apparatus according to claim 3, wherein the determination unit is configured to use, as the normal range, a range based on a statistic corresponding to a correction value obtained by correcting the photoelectric signal output by each of the plurality of light emitting devices by the correction map.

5. The test apparatus according to claim 3, wherein the determination unit is configured to use, as the normal range, a range based on a statistic corresponding to a correction value obtained by correcting the photoelectric signals output by the light emitting devices disposed at a same position among sets of the plurality of light emitting devices by the correction map in measurement results obtained by performing a plurality of measurements by the measuring unit while sequentially changing the set of the plurality of light emitting devices to be tested from a light emitting device group.

6. The test apparatus according to claim 1, wherein the second measuring unit includes a same number of sensors as the plurality of light emitting devices, and each of the plurality of sensors is disposed at a same position as the position of each of the plurality of light emitting devices.

7. The test apparatus according to claim 6, further comprising:
a calibration unit configured to calibrate measurement values by the plurality of sensors of the second measuring unit by a surface light source of which uniformity has been calibrated.

8. The test apparatus according to claim 1, wherein the second measuring unit includes a two-dimensional luminance meter for collectively measuring an intensity of light with which the position of each of the plurality of light emitting devices is irradiated.

9. The test apparatus according to claim 1, further comprising:
a generation unit configured to generate the correction map on a basis of an average value of the photoelectric signals output by the light emitting devices disposed at a same position among sets of the plurality of light emitting devices in measurement results obtained by performing a plurality of measurements by the measuring unit while sequentially changing the set of the plurality of light emitting devices to be tested from the light emitting device group.

10. The test apparatus according to claim 1, further comprising:
a temperature control unit configured to suppress temperature rise of the plurality of light emitting devices due to irradiation with the light.

11. The test apparatus according to claim 10, wherein the temperature control unit includes an air blowing mechanism that blows air toward the plurality of light emitting devices, the test apparatus further comprising:

a static electricity removing unit configured to prevent the plurality of light emitting devices from being charged with static electricity when air is blown by the air blowing mechanism.

12. A test apparatus comprising:
an electrical connection unit configured to be electrically connected to a terminal of each of a plurality of light emitting devices to be tested;
a light source unit configured to collectively irradiate the plurality of light emitting devices with light;
a measuring unit configured to measure a photoelectric signal which is obtained by photoelectrically converting the light irradiated by the light source unit and output via the electrical connection unit by each of the plurality of light emitting devices;
an acquisition unit configured to acquire a correction map including a correction value for correcting a variation in intensity of light with which a position of each of the plurality of light emitting devices is irradiated by the light source unit; and
a determination unit configured to determine a quality of each of the plurality of light emitting devices on a basis of a measurement result by the measuring unit and the correction map acquired by the acquisition unit, and further comprising:
a second measuring unit configured to measure an intensity of light with which positions of several light emitting devices are irradiated, which is a part of the light with which the position of each of the plurality of light emitting devices is irradiated by the light source unit; and
a generation unit configured to interpolate an intensity of light with which positions of rest of the light emitting devices are irradiated other than the several light emitting devices, among the plurality of light emitting devices on a basis of a second measurement result by the second measuring unit, and to generate the correction map.

13. The test apparatus according to claim 12, wherein the second measuring unit includes a smaller number of sensors than the plurality of light emitting devices, each of the plurality of sensors is disposed at a position of the several light emitting devices, and the plurality of sensors are separated from each other by a predetermined interval.

14. The test apparatus according to claim 12, wherein the second measuring unit includes a two-dimensional luminance meter for collectively measuring an intensity of light with which positions of the several light emitting devices are irradiated, and
a number of pixels of the two-dimensional luminance meter is smaller than a number of pixels of another two-dimensional luminance meter for collectively measuring an intensity of light with which a position of each of the plurality of light emitting devices is irradiated.

15. A test apparatus comprising:
an electrical connection unit configured to be electrically connected to a terminal of each of a plurality of light emitting devices to be tested;
a light source unit configured to collectively irradiate the plurality of light emitting devices with light;
a measuring unit configured to measure a photoelectric signal which is obtained by photoelectrically converting the light irradiated by the light source unit and output via the electrical connection unit by each of the plurality of light emitting devices;

an acquisition unit configured to acquire a correction map including a correction value for correcting a variation in intensity of light with which a position of each of the plurality of light emitting devices is irradiated by the light source unit; and
a determination unit configured to determine a quality of each of the plurality of light emitting devices on a basis of a measurement result by the measuring unit and the correction map acquired by the acquisition unit, and further comprising:
a second measuring unit configured to sequentially measure an intensity of light with which a position of each of the plurality of light emitting devices is irradiated by the light source unit by sequentially moving the position of each of the plurality of light emitting devices; and
a generation unit configured to generate the correction map on a basis of a second measurement result by the second measuring unit.

* * * * *